United States Patent [19]

Morrison et al.

[11] Patent Number: 4,581,497

[45] Date of Patent: Apr. 8, 1986

[54] SYSTEM FOR MONITORING CATHODIC PROTECTION SYSTEM OF MARINE INSTALLATIONS INCLUDING AN IMPROVED REEL

[75] Inventors: Keith L. Morrison; Jeffrey P. Speligene; Melvin G. Gibson, all of Edmond; Olen L. Riggs, Jr., Bethany, all of Okla.

[73] Assignee: Transworld Drilling Company, Oklahoma City, Okla.

[21] Appl. No.: 587,627

[22] Filed: Mar. 8, 1984

[51] Int. Cl.⁴ .................. H02G 11/02; B65H 75/02; G01R 27/02

[52] U.S. Cl. .................. 191/12.2 R; 242/84.8; 242/96; 324/65 CR

[58] Field of Search .................. 191/12.2 R, 12.2 A, 191/12.4; 242/84.8, 96, 115, 118.4, 118.8; 73/86; 324/65 CR, 64

[56] References Cited

U.S. PATENT DOCUMENTS

| | | |
|---|---|---|
| 1,704,151 | 3/1929 | Simpson . |
| 2,589,500 | 3/1952 | Landon et al. ............... 242/84.8 X |
| 3,001,738 | 9/1961 | Quenot .......................... 242/84.8 |
| 3,565,363 | 2/1971 | Mizuguchi et al. ............ 242/115 |
| 3,806,059 | 4/1974 | Quenot ........................ 242/96 X |
| 3,830,443 | 8/1974 | Quenot ........................ 242/96 X |
| 3,858,823 | 1/1975 | Quenot .......................... 242/84.8 |
| 3,870,245 | 3/1975 | Witteborg, Jr. ............ 242/118.4 X |
| 3,979,833 | 9/1976 | Grundman .................... 242/96 X |
| 3,983,977 | 10/1976 | Crabb .......................... 191/12.4 |
| 4,106,719 | 8/1978 | Haverland ...................... 242/96 |
| 4,134,746 | 3/1979 | Lowery ........................ 191/12.4 |
| 4,261,525 | 4/1981 | Wagner ........................ 242/96 X |
| 4,272,036 | 6/1981 | Waterman ...................... 242/96 |
| 4,284,180 | 8/1981 | Masters ...................... 191/12.2 R |
| 4,318,461 | 3/1982 | Brorein ...................... 191/12.2 R |

OTHER PUBLICATIONS

Photograph of commercially available reel.
Specification sheet for exhibit A.

Primary Examiner—Robert B. Reeves
Assistant Examiner—David F. Hubbuch
Attorney, Agent, or Firm—William G. Addison

[57] ABSTRACT

An improved system for monitoring cathodic protection systems for marine installations wherein a reference electrode is utilized to measure and periodically monitor the cathodic reference potentials. The reference electrode is connected to one end of a cable and the opposite end portion of the cable is operatively connected to a reel. The reel is connected electrically to the marine installation through a voltmeter and the voltmeter provides readouts of the measured cathodic reference potentials. The present invention includes an improved reel which includes a contactor assembly adapted to maintain electrical continuity between the reel and the voltmeter as the cable is being wound onto and unwound from portions of the reel. The improved reel also includes a handle assembly having a storage position and an operating position wherein the handle assembly is adapted to cooperate in rotating portions of the reel to wind the cable onto and unwind the cable from portions of the reel and wherein the handle assembly is operable to lock the reel to prevent rotation of portions of the reel in the storage position of the handle assembly. The reel also includes a guide for guiding the cable as the cable is wound onto and unwound from portions of the reel.

36 Claims, 17 Drawing Figures

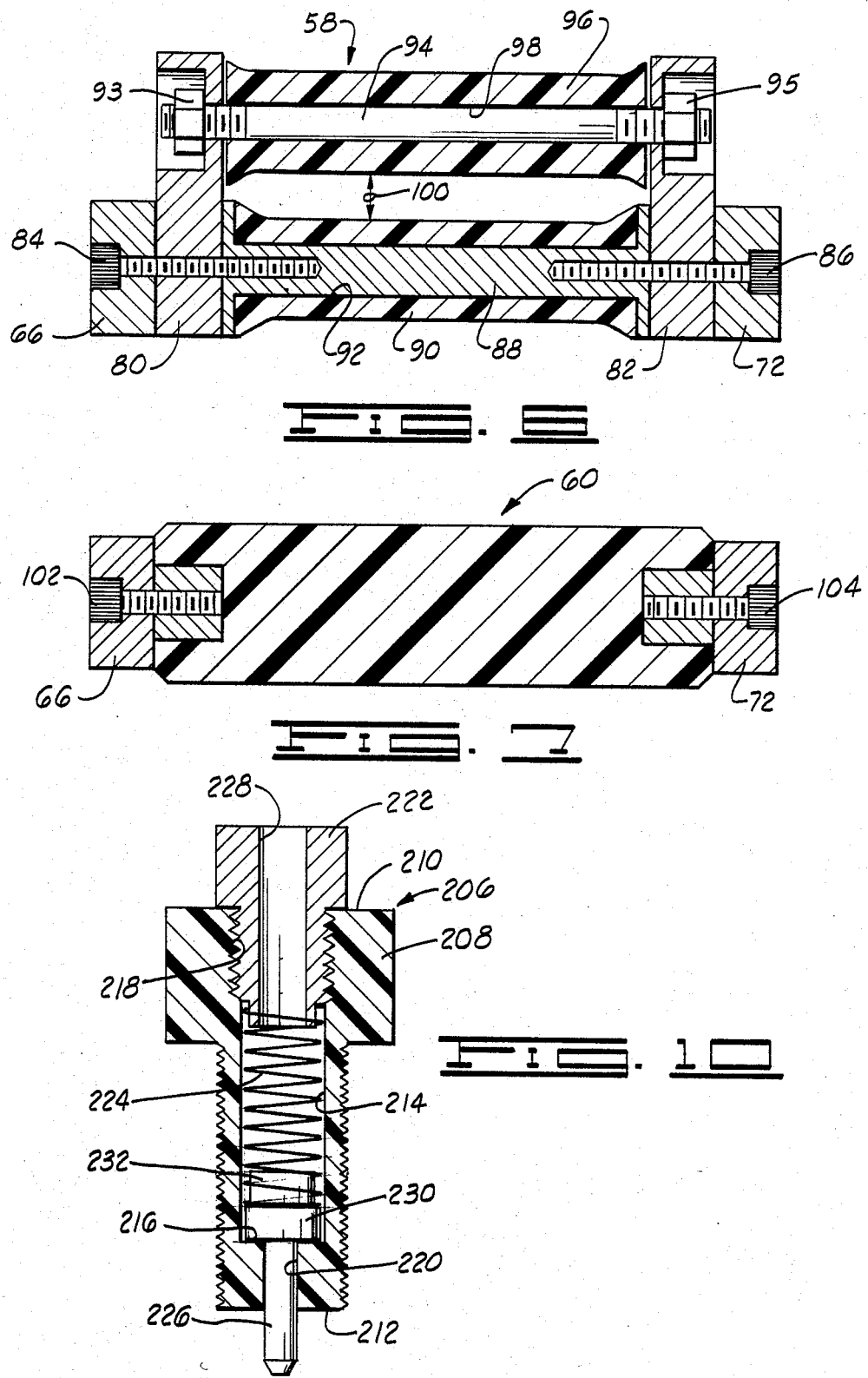

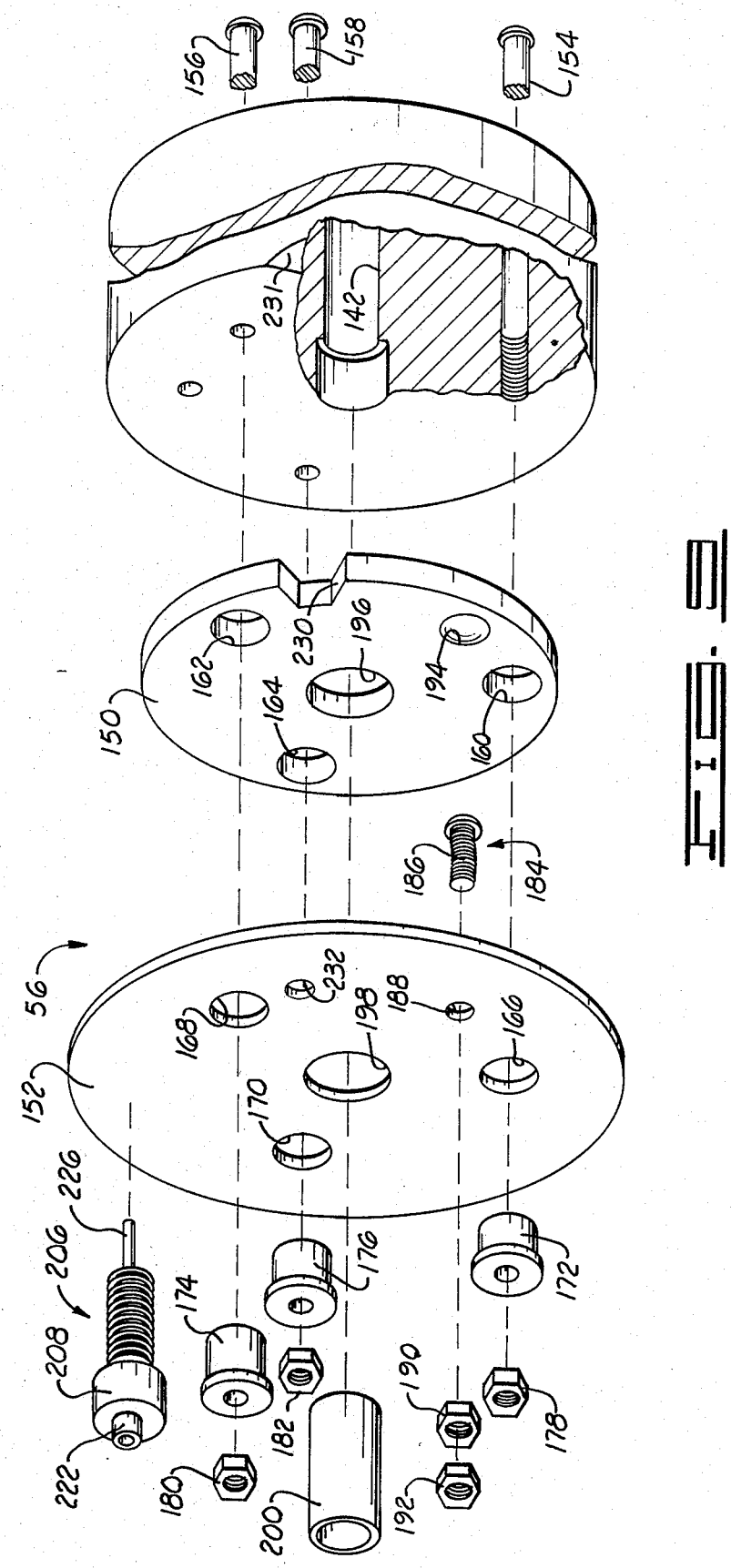

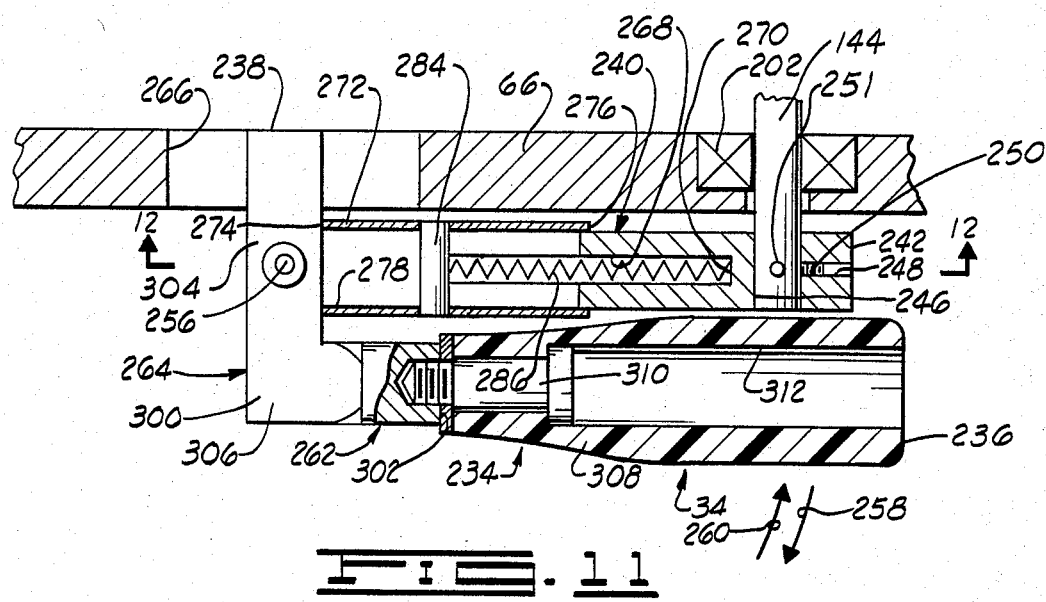
FIG. 11
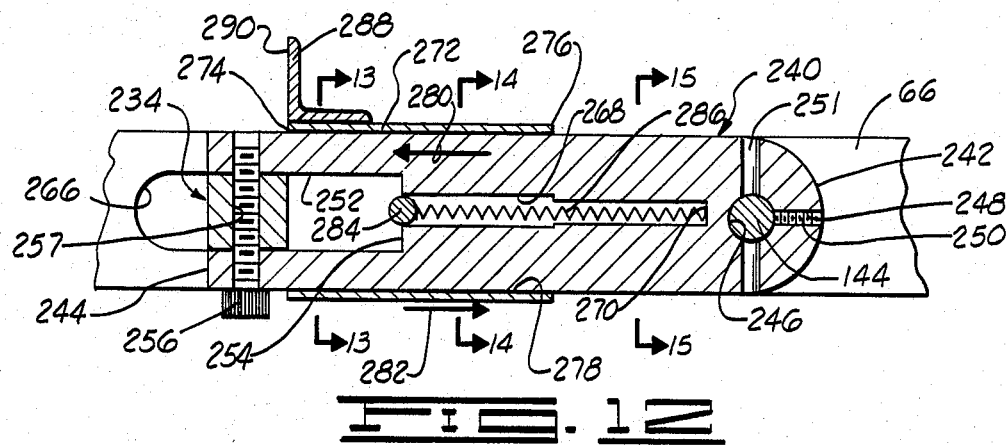
FIG. 12
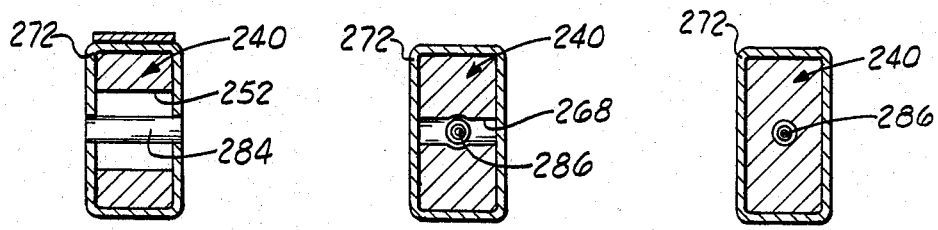
FIG. 13   FIG. 15
FIG. 14

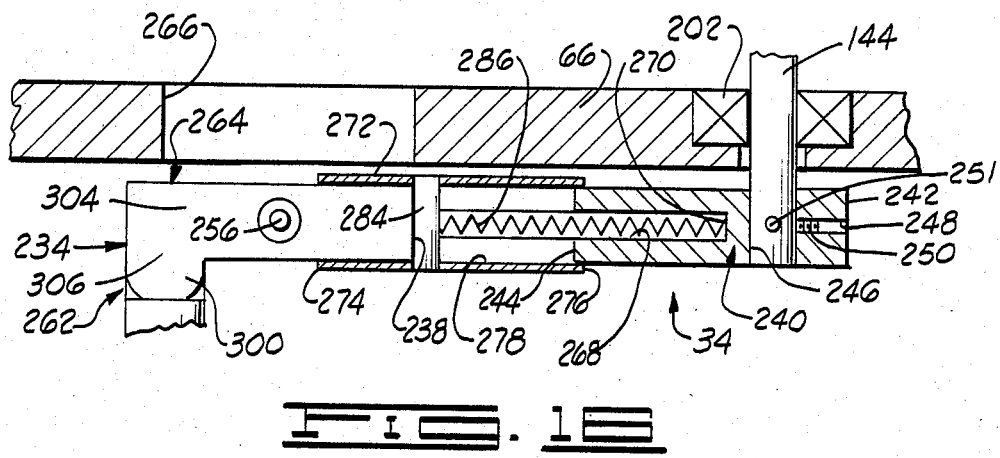
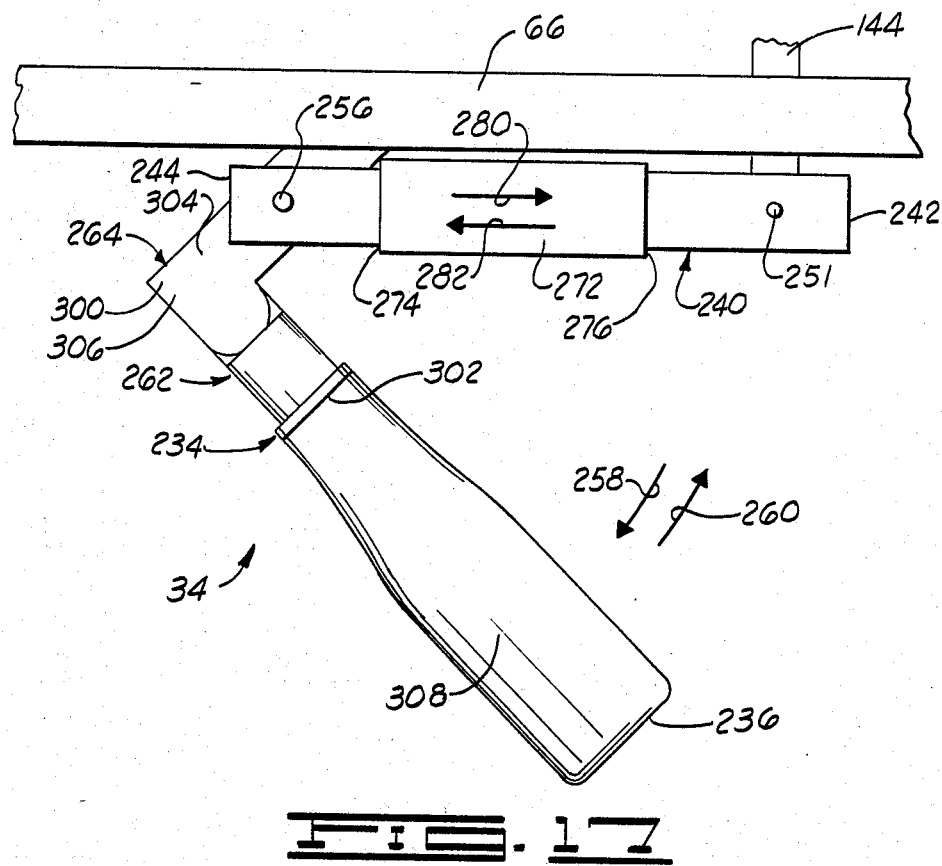

SYSTEM FOR MONITORING CATHODIC PROTECTION SYSTEM OF MARINE INSTALLATIONS INCLUDING AN IMPROVED REEL

CROSS REFERENCE TO RELATED APPLICATIONS

The subject matter in the present application is related to the subject matter disclosed in the co-pending application entitled REEL HAVING A REMOVABLE HUB, U.S. Ser. No. 587,629, filed Mar. 8, 1984, and assigned to the Assignee of the present invention.

BACKGROUND OF THE INVENTION

Field of the Invention

The present invention relates generally to systems for monitoring cathodic protection systems for marine installations and, more particularly, but not by way of limitation, to an improved system for monitoring cathodic protection systems for marine installations wherein a reference electrode is utilized to measure cathodic reference potentials and the reference electrode is moved into positions for monitoring the cathodic reference potentials by an improved reel, the present invention also contemplating an improved reel.

BRIEF DESCRIPTION OF THE DRAWINGS

FIG. 6 is a cross section of the reel shown in FIGS. 2, 3, 4 and 5, taken substantially along the line 6—6 of FIG. 2, and showing the guide assembly.

FIG. 7 is a cross section of the reel shown in FIGS. 2, 3, 4 and 5, taken substantially along the line 7—7 of FIG. 2, and showing the reel grip.

FIG. 9 is an exploded view of the contactor assembly portion of the reel shown in FIGS. 2, 3, 4 and 5.

FIG. 10 is a cross section of the non-rotatable portion of the contactor assembly of the reel.

FIG. 11 is a cross section primarily showing the handle assembly of the reel shown in FIGS. 2, 3, 4 and 5, taken substantially along the line 11—11 of FIG. 3, the handle assembly being shown in the locked position.

FIG. 12 is a cross section primarily showing a portion of the handle assembly of the reel shown in FIGS. 2, 3, 4 and 5, taken substantially along the line 12—12 of FIG. 11, the handle assembly being shown in the operating position.

FIG. 13 is a cross section of a portion of the handle assembly, taken substantially along the line 13—13 of FIG. 12.

FIG. 14 is a cross section of a portion of the handle assembly of the reel, taken substantially along the line 14—14 of FIG. 12.

FIG. 15 is a cross section of a portion of the handle assembly of the reel, taken substantially along the line 15—15 of FIG. 12.

FIG. 16 is a cross section of the handle assembly, similar to FIG. 11, but showing the handle assembly in the operating position.

FIG. 17 is a plan view of the handle assembly of the reel, illustrating the handle assembly in a position intermediate of the locked position and the operating position.

DESCRIPTION OF THE PREFERRED EMBODIMENT

Figure 1:
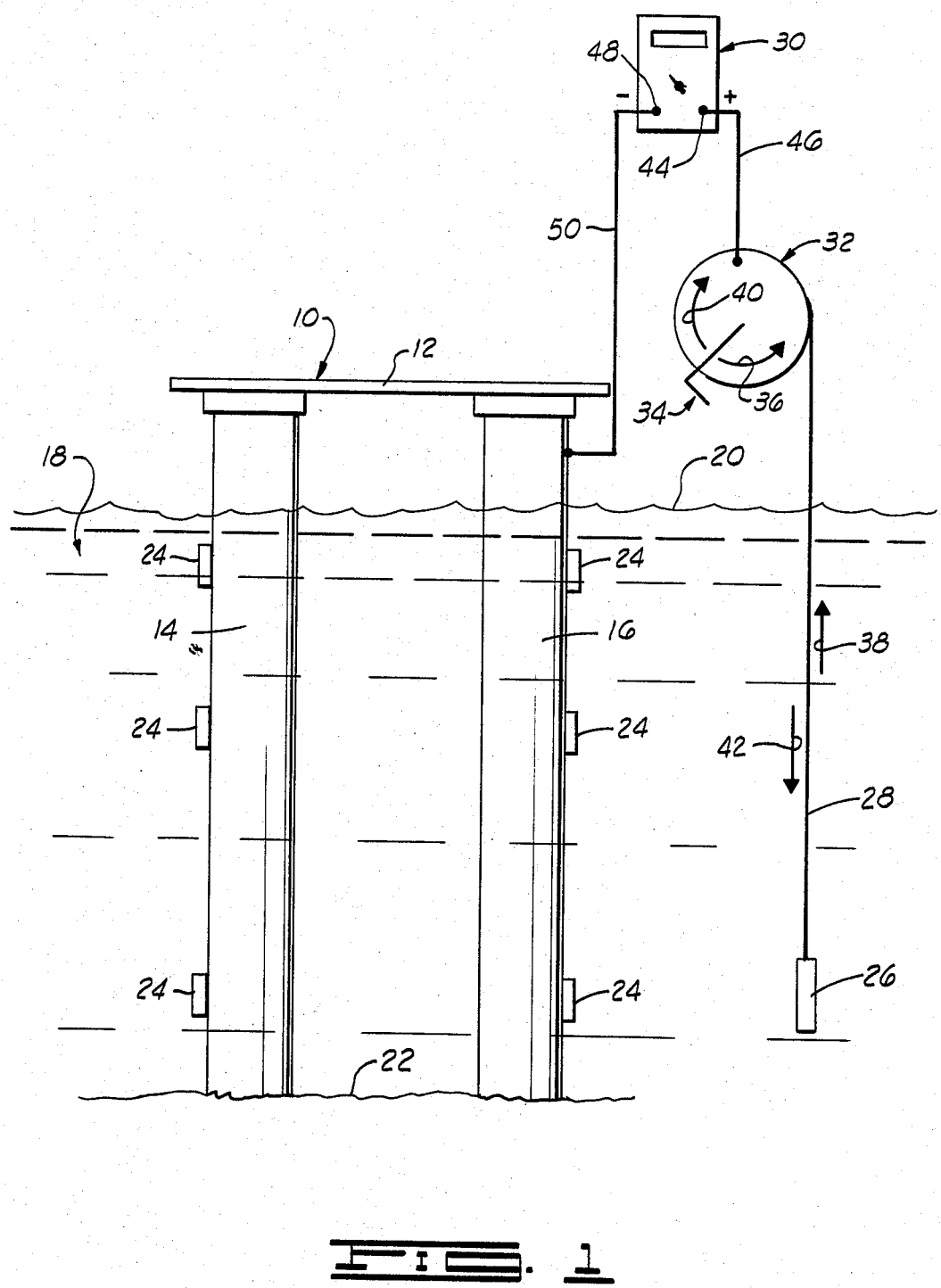
FIG. 1 is a schematic, diagrammatic view of a marine installation and a system for measuring cathodic reference potentials to monitor the effectiveness of the cathodic protection system which is constructed in accordance with the present invention and which utilizes an improved reel in such system, the improved reel also being constructed in accordance with the present invention.

Various cathodic protection systems have been developed for controlling corrosion of various structures. Marine installations such as off-shore production platforms and off-shore drilling rigs utilize cathodic protection systems for controlling corrosion on submerged surfaces. Shown in FIG. 1 is a diagrammatic view of a marine installation 10 having a platform 12 with legs 14 and 16 connected to the platform 12 and extending into a body of water 18 having a surface 20 and a floor 22. It should be noted that off-shore marine installations commonly include a plurality of legs and only two legs have been shown in FIG. 1 for the purpose of illustrating the present invention. The legs 14 and 16 support the platform 12 above the surface 20 of the body of water 18 and one end of each of the legs 14 and 16 is supported on the floor 22 of the body of water 18.

In a cathodic protection system for off-shore marine installations it is common to install sacrificial electrodes on the legs 14 and 16 (submerged surfaces) at various spaced apart positions along the length of the legs 14 and 16, thereby positioning the sacrificial electrodes on each leg 14 and 16 at various depths in the body of water 18 (three electrodes 24 being shown in FIG. 1 on each leg 14 and 16 for example, although in an actual off-shore marine installation many more sacrificial electrodes commonly are connected to the legs). During the functioning of the cathodic protection system, the sacrificial electrodes 24 deteriorate and, when the sacrificial electrodes 24 deteriorate to a known extent, the cathodic protection system for the submerged surfaces becomes ineffective to control corrosion. Thus, it is necessary from time-to-time to monitor the deterioration of the sacrificial electrodes 24 or, in other words, to monitor the effectiveness of the cathodic protection system so the sacrificial electrodes 24 can be replaced before the deterioration of such sacrificial electrodes 24 reaches such an extent that the cathodic protection system becomes ineffective to control corrosion of the submerged surfaces. The effectiveness of the cathodic protection system is measured by periodically measuring the cathodic reference potentials using a reference electrode positioned within the area of influence of the sacrificial electrodes 24.

To measure the cathodic reference potentials, a reference electrode 26 is attached to one end of an insulated cable 28 so the reference electrode 26 is in electrical communication with the cable 28. The cable 28 is utilized to lower the reference electrode 26 in the body of water 18 to a predetermined depth (within the influence of one or more of the sacrificial electrode 24). The opposite end of the cable 28 is connected to a voltmeter 30 and the voltmeter 30 also is connected to the marine installation 10, as shown in FIG. 1, thereby connecting the cable 28 to the marine installation 10 through the voltmeter 30 and establishing electrical continuity between the reference electrode 26 and the marine installation 10 through the cable 28 and the voltmeter 30 which is interposed between the reference electrode 26 and the marine installation 10. The cathodic reference potential then is provided by the voltmeter 30 readout. This process is repeated numerous times and at various times and, with respect to an off-shore marine installation, this process typically may have to be repeated several times in connection with a single monitoring of the cathodic protection system.

As shown in FIG. 1, the end of the cable 28, opposite the end connected to the reference electrode 26 more particularly is connected to a reel 32 having a handle assembly 34 and the reel 32 is connected to the marine installation 10 through the voltmeter 30. The handle assembly 34 is connected to a portion of the reel 32 so that rotation of the handle assembly 34 in a winding direction 36 winds portions of the cable 28 onto a portion of the reel 32 thereby moving the reference electrode 26 in a generally upwardly direction 38 through the body of water 18 and so that rotation of the handle assembly 34 in an opposite unwinding direction 40 unwinds portions of the cable 28 from a portion of the reel 32 thereby moving the reference electrode 26 in a generally downwardly direction 42 through the body of water 18 for positioning the reference electrode 26 at the various positions for determining the cathodic reference potentials in the manner mentioned before.

More particularly, the voltmeter 30 includes a plug receiver 44 and a plug on one end of a cable connector 46 is removably disposed in the plug receiver 44, the opposite end of the cable connector 46 being connected to the reel 32 in a manner to be described in greater detail below. The voltmeter 30 also includes a plug receiver 48 and a plug on one end of a cable connector 50 is removably disposed in the plug receiver 48, the opposite end of the cable connector 50 being connected to the marine installation 10. The cable connectors 46 and 50 cooperate with the cable 28 and the reel 32 to establish electrical continuity between the reference electrode 26 and the marine installation 10 by way of the voltmeter 30.

The cathodic protection system just described in connection with the marine installation 10 and the use of a reference electrode connected to one end of a cable with the opposite end of the cable being connected to the marine installation through a voltmeter and a reel for positioning the reference electrode with the reel being connectable to the cable and to the voltmeter for determining cathode reference potentials are well known in the art. However, the present invention, more particularly, provides an improved reel 32 for use in monitoring such cathodic protection systems.

The improved reel 32 is shown in FIGS. 2, 3, 4 and 5 in greater detail. The improved reel of the present invention includes the handle assembly 34, a hub assembly 52, a frame assembly 54, a contactor assembly 56, a cable guide 58, a reel grip 60, and a meter support 62.

The hub assembly 52 is rotatingly supported on the frame assembly 54 so that the hub assembly 52 is rotatable in the winding and unwinding directions 36 and 40, respectively, and the handle assembly 34 is connected to the hub assembly 52 so that the handle assembly 34 is rotatable in the directions 36 and 40 for rotating the hub assembly 52 in the directions 36 and 40. The contactor assembly 56 has a rotatable portion which is connected to the hub assembly 52 and which rotates with the rotation of the hub assembly 52, and a non-rotatable portion which is mounted on the frame assembly 54 and which has a portion slidingly contacting the rotatable portion of the contactor assembly 56. The meter support 62 is connected to the frame assembly 54 and the meter support 62 is adapted to receive and supportingly retain the voltmeter 30 (the voltmeter 30 being shown diagrammatically in FIG. 1 and being shown in dashed lines retained within the meter support 62 in FIG. 4). The non-rotatable portion of the contactor assembly 56 is adapted to be connected to the voltmeter 30 which is disposed within and supported by the meter support 62 which is connected to the frame assembly 54. Thus, the voltmeter 30 is supportable on the reel 32.

The cable guide 58 is connected to the frame assembly 54 and the cable guide 58 is adapted to guidingly receive portions of the cable 28, the cable guide 58 cooperating to guide the cable 28 with respect to the hub assembly 52 as portions of the cable 28 are being wound onto the hub assembly 52 and as portions of the cable 28 are being unwound from the hub assembly 52. One end portion of the cable 28, opposite the end portion of the cable 28 which is connected to the reference electrode 26, extends through the cable guide 58 and this end portion of the cable 28 is operatively connected to the hub assembly 52 in a manner which will be described in greater detail below (the cable 28 being shown in FIG. 5 extending through the cable guide 58). The end of the end portion of the cable 28 which is operatively connected to the hub assembly 52 is connected to the rotatable portion of the contactor assembly 56 so electrical continuity is established and maintained between the reference electrode 26 and the rotatable portion of the contactor assembly 56 during the rotation of the hub assembly 52 and the rotatable portion of the contactor assembly 56 connected thereto. The sliding contact maintained between the non-rotatable portion of the contactor assembly 56 and the rotatable portion of the contactor assembly 56 is adapted to establish electrical continuity between the rotatable portion and the non-rotatable portion of the contactor assembly and, thus, the sliding contact between the rotatable portion and the non-rotatable portion of the contactor assembly 56 is adapted to maintain electrical continuity between the reference electrode 26 and the non-rotatable portion of the contactor assembly 56 during the rotation of the hub assembly 52 and the rotatable portion of the contactor assembly 56 connected thereto. The non-rotatable portion of the contactor assembly 56 is adapted to be connected to the voltmeter 30 for establishing electrical continuity between the contactor assembly 56 and the voltmeter 30 or, in other words, for establishing electrical continuity between the reference electrode and the voltmeter 30 by way of the cable 28 and the contactor assembly 56 and the connection between the contactor assembly 56 and the voltmeter 30 provided by the cable connector 46.

Figure 2:
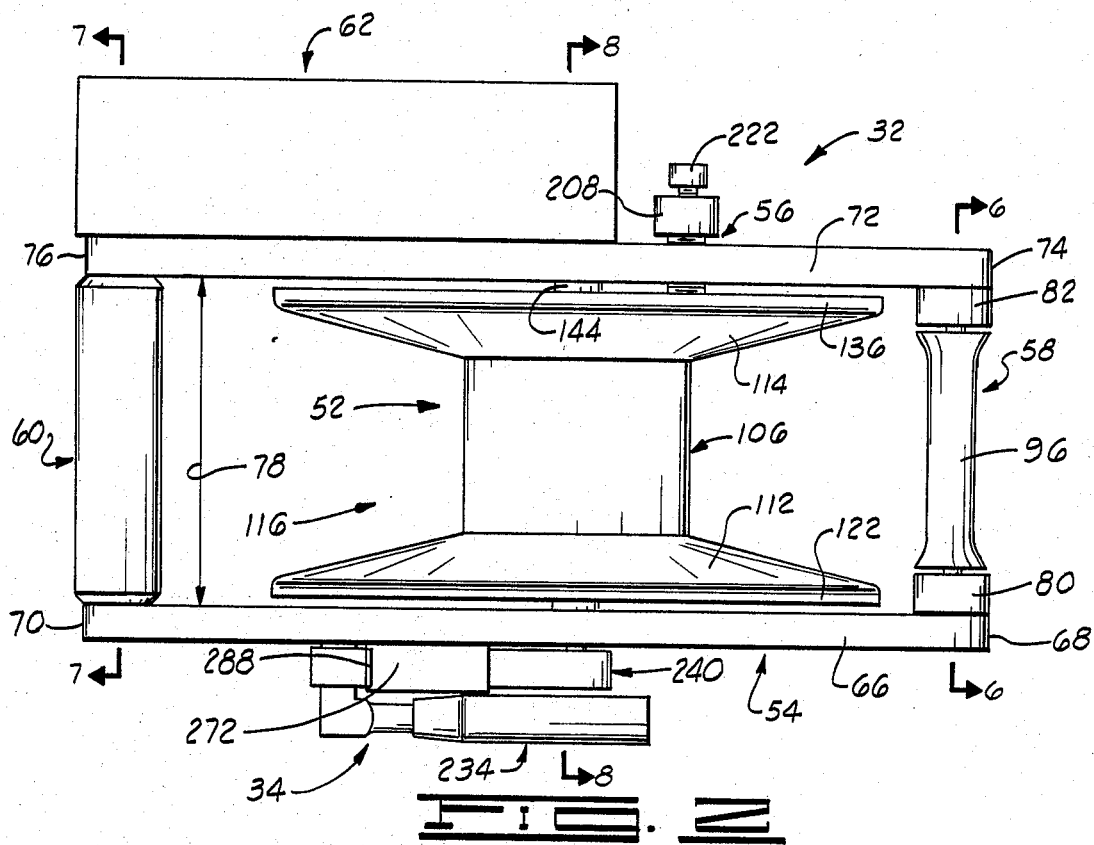
FIG. 2 is a plan view of the reel used in the system shown in FIG. 1.
Figure 3:
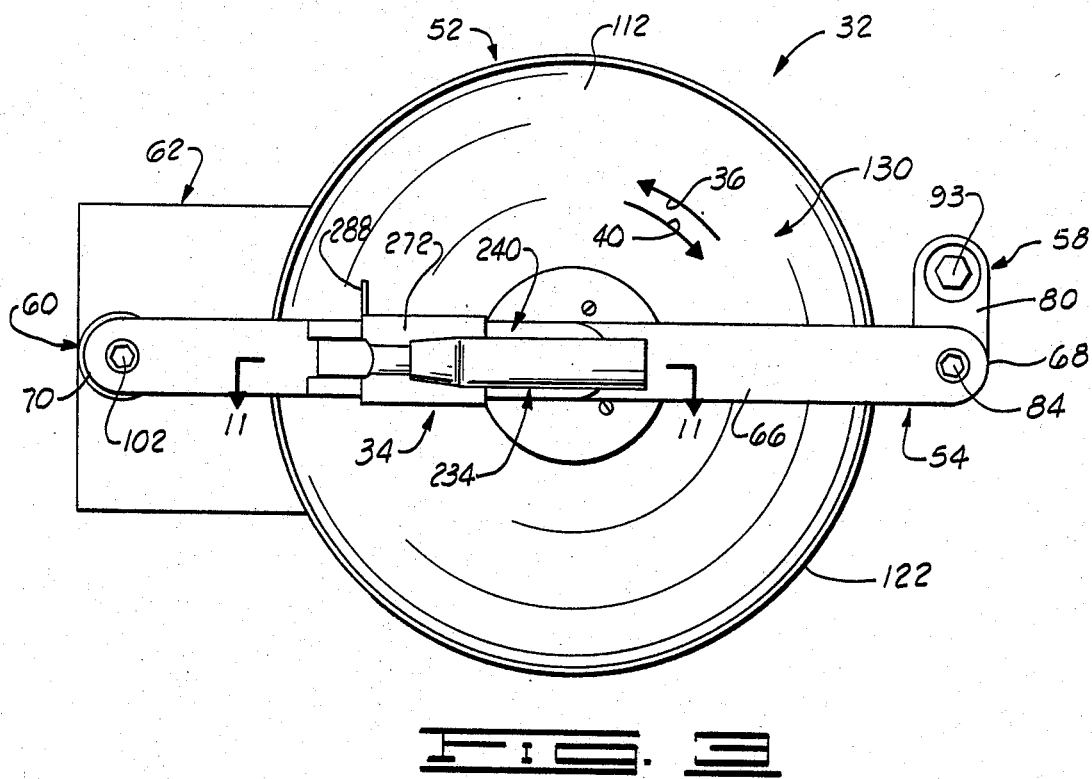
FIG. 3 is an elevational view of one side of the reel shown in FIG. 2.
Figure 5:
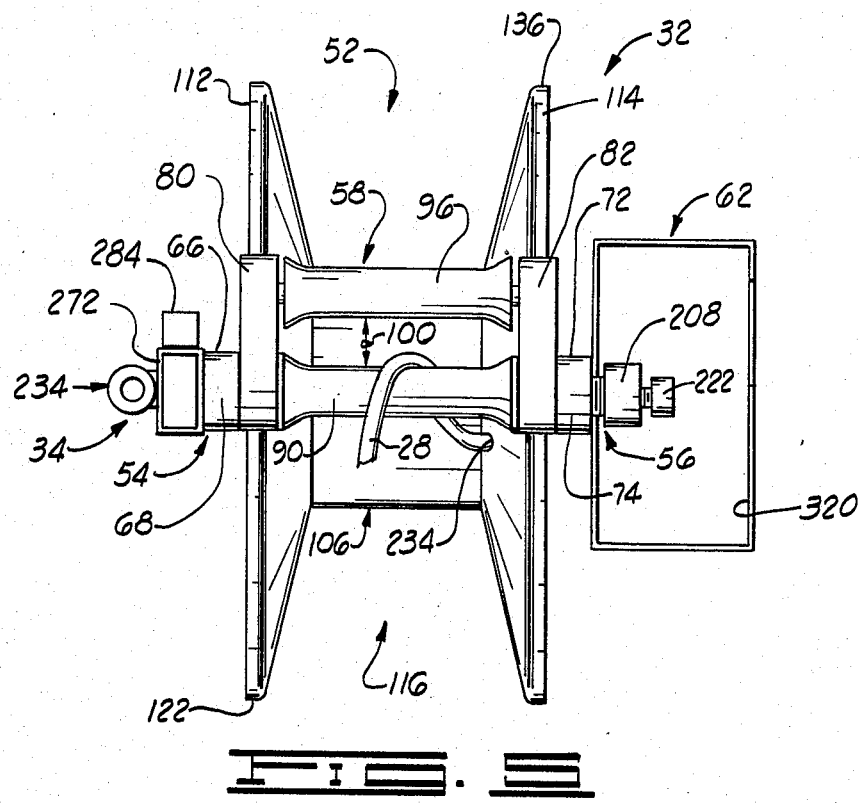
FIG. 5 is an elevational view of one end of the reel shown in FIGS. 2, 3 and 4.

The handle assembly 34 has an operating position and a locked position, the handle assembly 34 being shown in the locked position in FIGS. 2, 3 and 5 and the handle assembly 34 being shown in the operating or unlocked position in FIG. 16, for example. A portion of the handle assembly 34 is connected to the hub assembly 52 and a portion of the handle assembly 34 is removably connectable to a portion of the frame assembly 54. When the handle assembly is moved to the locked position, a portion of the handle assembly 34 is removably connected to a portion of the frame assembly 54 for locking the hub assembly 52 and the handle assembly 34 to the frame assembly 54 to prevent rotation of the handle assembly 34 and the hub assembly 52 connected thereto. When the handle assembly 34 is moved from the locked position to the operating position, the handle assembly 34 is removed or disconnected from the frame assembly 34 and the handle assembly 34 is positioned for rotating the handle assembly 34 and the hub assembly 52 connected thereto in the directions 36 and 40.

In operation, the end of the cable 28, opposite the end of the cable 28 which is connected to the reference electrode 26, is disposed through the cable guide 58 (shown in FIG. 5) and this end portion of the cable 28 is operatively connected to the hub assembly 52 in a manner to be described in greater detail below. Further, the end of the cable 28, opposite the end of the cable 28 which is connected to the reference electrode 26, is connected to the rotatable portion of the contactor assembly 56, also in a manner to be described in greater detail below. The voltmeter 30 is disposed and maintained within the meter support 62. One end of the cable connector 46 then is removably connected to the non-rotatable portion of the contactor assembly 56 and the opposite end of the cable connector 46 then is removably connected to the plug receiver 44 on the voltmeter 30. One end of the cable connector 50 is connected to the plug receiver 48 on the voltmeter 30 and the opposite end of the cable connector 50 is connected to the marine installation 10. Thus, electrical continuity is established between the reference electrode 26 and the rotatable portion of the contactor assembly 56 by way of the cable 28, electrical continuity is established between the rotatable portion and the non-rotatable portion of the contactor assembly 56 thereby establishing electrical continuity between the reference electrode 26 and the non-rotatable portion of the contactor assembly 56 by way of the cable 28 and the sliding contact between the rotatable portion and the non-rotatable portion of the contactor assembly 56, electrical continuity is established between the non-rotatable portion of the contactor assembly 56 and the voltmeter 30 by way of the cable connector 46 and electrical continuity is established between the voltmeter 30 and the marine installation 10 by way of the cable connector 50. Thus, in this operating position, electrical continuity is established between the reference electrode 26 and the marine installation 10 by way of the reel 32 and the voltmeter 30, and the sliding contact between the rotatable portion and the non-rotatable portion of the contactor assembly 56 operates to maintain electrical continuity between the cable 28 and the voltmeter 30 as the hub assembly 52 and the rotatable portion of the contactor assembly 56 are rotated in the directions 36 and 40. The operator with the reel 32 then positions the reel 32 in a position generally on the platform 10 for lowering the cable 28 into the body of water 18. The operator then moves the handle assembly 32 from the locked position to the operating position and the operator rotates the handle assembly 34 in the unwinding direction 40 thereby causing portions of the cable 28 which are wound onto the hub assembly 54 to be unwound from the hub assembly 54 and thereby lowering the cable 28 and the reference electrode 26 connected thereto into the body of water 18 in the direction 42. The operator lowers the cable 28 and the reference electrode 26 connected thereto in the direction 42 until the reference electrode 26 is positioned within the area of influence of one of the sacrificial electrodes 24 (the voltmeter 30 readout provides the indication to the operator that the reference electrode 26 in fact has been positioned within the area of influence of one of the sacrificial electrodes) and, when the reference electrode 26 has been positioned in the area of influence of one of the sacrificial electrodes, the operator reads the cathodic reference potential from the readout of the voltmeter 30. During the positioning of the reference electrode 26 within the area of influence of one of the sacrificial electrodes 24, it also may be necessary for the operator to move the reference electrode 26 in the generally upwardly direction 38 by rotating the handle assembly 34 in the winding direction 36. This process is repeated numerous times, as mentioned before, to determine the various cathodic reference potentials for determining the effectiveness of the protection provided by the cathodic protection system. At various times during the process of determining the cathodic reference potentials, it becomes necessary to set the reel 32 on the surface of the platform 12 or, in other words, it becomes necessary for the operator to ungrip the handle assembly 34. If the handle assembly 34 is released by the operator, the weight of the reference electrode 26 combined with the unreeled portions of the cable 28 causes the hub assembly 52 inadvertently to rotate in the unwinding direction 40 thereby inadvertently unwinding portions of the cable 28 from the hub assembly 52 and causing the hub assembly 52 physically to rotate in the direction 40 thereby moving the reel 32 when the reel 32 is positioned on a surface in such a manner that the hub assembly 52 can cause the reel 32 to be so moved. Thus, when it becomes necessary for the operator to release the handle assembly 34, the operator moves the handle assembly 34 from the operating position to the locked position wherein a portion of the handle assembly 34 is removably connected to the frame assembly 54 thereby locking the handle assembly 34 along with the hub assembly 52 connected thereto to the frame assembly 54 and preventing rotation of the handle assembly 34 or the hub assembly 52 connected thereto in either the direction 36 or 40.

The frame assembly, as shown in FIGS. 2, 3, 4 and 5, includes a first frame rail 66, having opposite first and second ends 68 and 70, respectively, and a second frame rail 72 having opposite first and second ends 74 and 76, respectively. The first and second frame rails 66 and 72 are positioned in a spaced apart relationship with the first end 68 of the first frame rail 66 being generally aligned with the first end 74 of the second frame rail 72, and with the second end 70 of the first frame rail 66 being generally aligned with the second end 76 of the second frame rail 72. The first and the second frame rails 66 and 72 extend in generally parallel planes and the first frame rail 66 is spaced a distance 78 (shown in FIG. 2) from the second frame rail 72.

The cable guide 58 is connected to the first ends 68 and 74 of the first and the second frame rails 66 and 72 and the cable guide 58 extends generally between the first ends 68 and 74 of the first and the second frame rails 66 and 72. The cable guide 58, not only functions to receive and guide portions of the cable 28, but the cable guide 58 also functions to connect the first ends 68 and 74 of the first and the second frame rails 66 and 72 and to support the first and the second frame rails 66 and 72 in the spaced apart relationship. Thus, in one sense, the cable guide 58 also functions as a part of the frame assembly 54.

As shown more clearly in FIGS. 5 and 6, the cable guide 58 includes a first bar 80 and a second bar 82. One end of the first bar 80 is secured to the first end 68 portion of the frame rail 66 by a fastener 84 and the first bar 80 extends a distance generally perpendicularly upwardly from the first end 68 portion of the first frame rail 66. One end of the second bar 82 is secured to the first end 74 portion of the second frame rail 72 by a fastener 86 and the second bar 82 extends a distance generally perpendicularly upwardly from the first end portion of the second frame rail 72. The first bar 80 is spaced a distance from the second bar 82 and the first bar 80 generally is aligned with the second bar 82.

As shown more clearly in FIG. 6, one end of a first shaft 88 is secured to the first bar 80 by way of the fastener 84 and the opposite end of the first shaft 88 is secured to the second bar 82 by the fastener 86, the fasteners 84 and 86 thus being oriented in an aligned relationship. A first roller 90 is rotatingly supported on the first shaft 88. More particularly, the first roller 90 has an opening 92 which extends axially through a central portion thereof and intersecting the opposite ends thereof, and the diameter of the opening 92 is slightly larger than the outside diameter of the first shaft 88 so the first roller 90 is rotatingly supported on the first shaft 88. The first roller 90 is cylindrically shaped with the opposite ends of the first roller 90 being flared in a generally outward direction, and the first roller 90 preferably is constructed of an electrically insulating material, such as a plastic material, which also functions to reduce friction with the first shaft 88 and the first roller 90 and to reduce friction between the first roller 90 and the cable 28 during the operation of the reel 32.

Also as shown more clearly in FIG. 6, one end of a second shaft 94 is secured to the first bar 80 by way of a nut 93 which threadedly engages one end of the second shaft 94 and which engages a portion of the first bar 80, and the opposite end of the second shaft 94 is secured to the second bar 82 by way of a nut 95 which is threadedly secured to one end of the second shaft 94 and which engages a portion of the second bar 82. One end of the second shaft 94 extends through an opening formed in the first bar 80 and the nut 93 threadedly engages this end of the second shaft 94 and a portion of the first bar 80 to securely connect the second shaft 94 to the first bar 80. The opposite end of the second shaft 94 extends through an opening formed in the second bar 82 and the nut 95 threadedly engages this end of the second shaft 94 and a portion of the second bar 82 to securedly connect this end of the second shaft 94 to the second bar 82. A second roller 96 is rotatingly supported on the second shaft 94. More particularly, the second roller 96 has an opening 98 which extends axially through a central portion thereof and intersects the opposite ends thereof, and the diameter of the opening 98 is slightly larger than the outside diameter of the second shaft 94 so the second roller 96 is rotatingly supported on the second shaft 94. The second roller 96 preferably is shaped exactly like the first roller 90 and thus the second roller 94 preferably is cylindrically shaped with end portions which are flared in an outward direction. The second roller 96, like the first roller 90, preferably is constructed of an electrically insulative material, such as a plastic material, which also functions to reduce friction between the second shaft 94 and the second roller 96 and to reduce friction between the second roller 96 and portions of the cable which may contact the second roller 96 during the operation of the reel 32.

The first roller 90 extends generally parallel with the second roller 96 and the outer peripheral surface of the first roller 90 is spaced a distance 100 from the outer peripheral surface of the second roller 96 to form a cable receiving opening therebetween adapted to receive portions of the cable 28 during the operation of the reel 32. The distance 100 is larger than the diameter formed by the outer peripheral surface of the cable 28, as shown in FIG. 5, so portions of the cable 28 easily extend through the cable receiving opening formed between the first and the second rollers 90 and 96.

As generally shown in FIG. 1 and as shown in more detail in FIG. 7, the reel grip 60 is a cylindrically shaped grip which preferably is constructed of a plastic material. One end of the reel grip 60 is secured to the second end 70 portion of the first frame rail 66 by a fastener 102 and the opposite end of the reel grip 60 is secured to the second end 76 portion of the second frame rail 72 by a fastener 104. The reel grip 60 generally is aligned with the cable guide 58, the reel grip 60 being spaced a distance from the cable guide 58 and the reel grip 60 being disposed generally on an opposite end or side of the reel 32 as opposed to the cable guide 58. The hub assembly 52 thus is supported generally between and spaced a distance from the reel grip 60 and the cable guide 58. The reel grip 60 extends between the second ends 70 and 76 of the first and the second frame rails 66 and 72 and the reel grip 60 connects the first and the second ends 70 and 76 of the first and the second frame rails 66 and 72. Thus, the reel grip 60 cooperates to support the first and the second frame rails 66 and 72 in the spaced apart relationship and, as such, the reel grip 60, in one sense, comprises a portion of the supporting structure of the frame assembly 54. The grip 60 is adapted to be operatively gripped by an individual to assist in enabling the individual to support the reel 32 by hand during operation of the reel 32.

Figure 8:
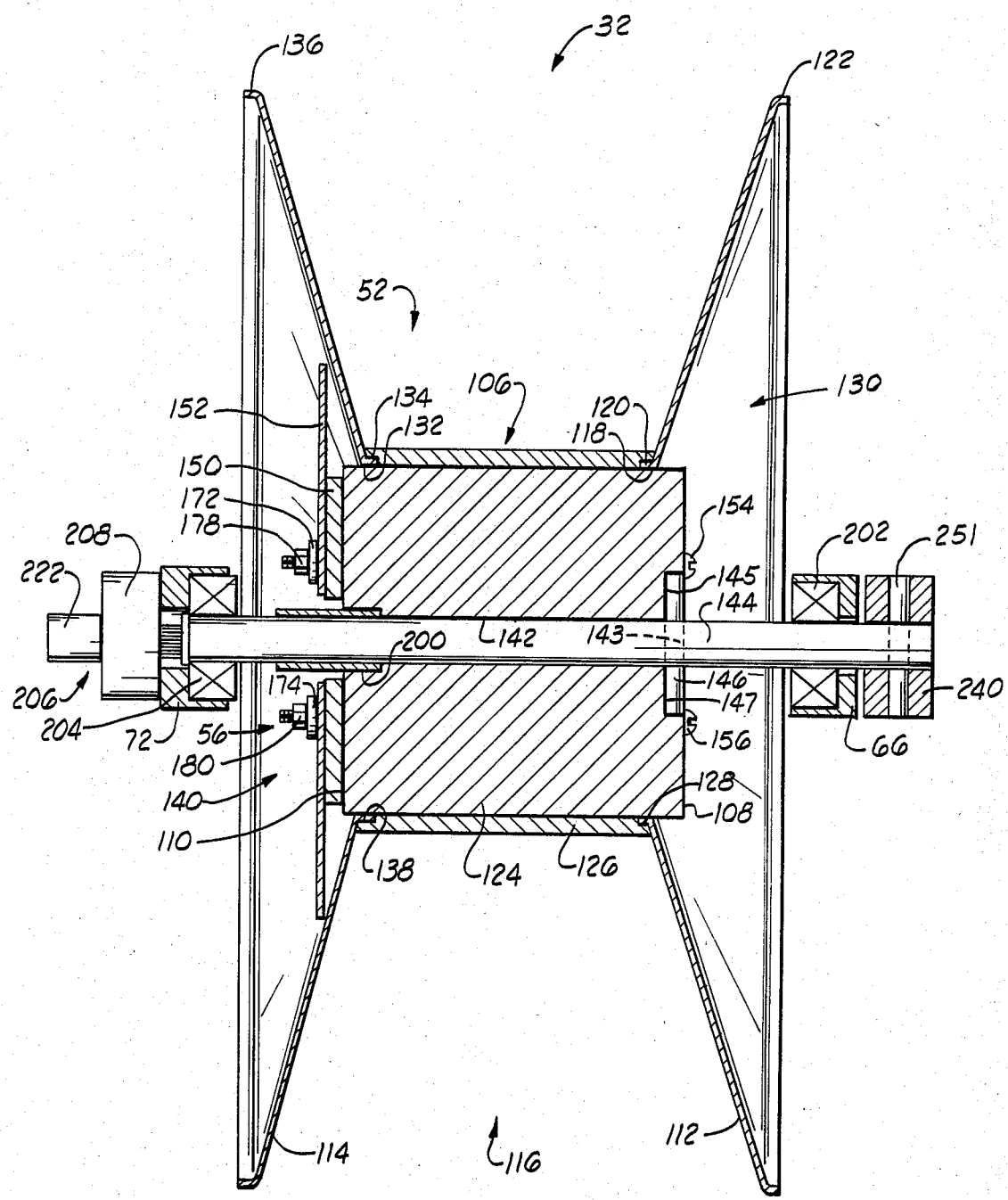
FIG. 8 is a cross section of the reel shown in FIGS. 2, 3, 4 and 5, taken substantially along the line 8—8 of FIG. 2.

As generally shown in FIGS. 2, 3, 4 and 5 and as shown more particularly in FIG. 8, the hub assembly 52 includes a cylindrically shaped base 106 having opposite first and second ends 108 and 110, respectively, and an outer peripheral surface. A central portion of a generally circularly shaped first side plate 112 is secured to the first end 108 of the base 106 and the first side plate 112 extends a distance radially outward from the outer peripheral surface of the base 106. A central portion of a generally cylindrically shaped second side plate 114 is secured to the second end 110 of the base 106 and the second side plate 114 extends a distance radially outward from the outer peripheral surface of the base 106. The base 106 is adapted so that a portion of the cable 28 can be wound generally about and generally unwound from the outer peripheral surface of the base 106, and the first and the second side plates 112 and 114 cooperate with the outer peripheral surface of the base 110 to form a cable receiving space 116 for retaining portions of the cable in a position generally wound about the base 106, the first and the second side plates 112 and 114 cooperating to retain portions of the cable wound about the outer peripheral surface of the base 106.

The cable guide 58, more particularly, functions to guide the cable 28 into the cable receiving space 116 and to prevent the cable 28 from contacting the outer peripheral surfaces 122 and 136 of the first and second side plates 112 and 114 as the cable 28 is wound onto or unwound from the hub assembly 52. The rotating outer peripheral surfaces 122 and 136 of the first and second side plates 112 and 114 can result in cutting the engaged portions of the cable 28 and the cable guide 58 cooperates to protect the cable 28 from such cutting.

As shown in FIG. 8, the first side plate 108, more particularly, has an opening 118 formed through the central portion thereof and a flanged portion 120 is formed about the opening 118, the flanged portion 120 extending a distance outwardly from the first side plate 108. The first side plate 108 extends a distance at an angle radially outward from the opening 118 terminating with the outer peripheral end surface 122 of the first side plate 112. The base 106, more particularly, includes a cylindrically shaped block 124 with a sleeve 126 which is press-fitted about the outer peripheral surface of the block 124. A counterbore 128 is formed in one end of the sleeve 126, thereby creating a recess between the sleeve 126 and the adjacent portions of the outer peripheral surface of the block 124. In an assembled position, the flanged portion 120 of the first side plate 112 is disposed in the recess created by the counterbore 128 and the flanged portion 120 is secured to the base 106 in this position. Thus, in the assembled position, the first side plate 112 extends a distance radially outward at an angle from the outer peripheral surface of the base 106 so a recessed area 130 is formed in the first side plate 112 with the first side plate 112 generally encompassing the recessed area 130, the plate 112 having a generally overall circular-dish shape.

The second side plate 114, more particularly, includes an opening 132 formed through a central portion thereof and a flanged portion 134 is formed about the opening 132, the flanged portion 134 extending a distance outwardly from the second side plate 114. The second side plate 114 extends a distance at an angle radially from the opening 132 terminating with the outer peripheral end surface 136 of the second side plate 114. A counterbore 138 is formed in the end of the sleeve 126, opposite the end having the counterbore 128 formed therein, thereby creating a recess between the sleeve 126 and the adjacent portions of the outer peripheral surface of the block 124. In the assembled position, the flanged portion 134 of the second side plate 114 is disposed in the recess created by the counterbore 138 and the flanged portion 134 is secured to the base 106 in this position. Thus, in the assembled position, the second side plate 114 extends a distance radially outwardly at an angle from the outer peripheral surface of the base 106 so a recessed area 140 is formed in the second side plate 114 with the second side plate 114 generally encompassing the recessed area 140, the second side plate 140 having a generally circular-dish shape. It should be noted that in one form, the first and the second side plates can be of identical construction so the first and the second side plates 112 and 114 are interchangeable; however, in this form and in an operating position wherein the first and the second side plates 112 and 114 are connected to the base 106, the first side plate 112 will include an additional opening for accommodating the cable 28 which will not be utilized, such opening to be described in greater detail below with respect to the construction of the second side plate 114.

An opening 142 is formed through a central portion of the base 106 and a hub shaft 144 extends through the opening 142, a portion of the hub shaft 144 extending a distance from the first end 108 of the base 106 and an opposite end portion of the hub shaft 144 extending a distance from the second end 110 of the base 106. An opening 143 is formed through the hub shaft 144 and a key member 146 extends through the opening 143 formed through the hub shaft 104 with portions of the key member 146 extending radially outwardly from the hub shaft 144 in opposite directions. A portion of the key member 146 extends in a radial direction from the outer peripheral surface of the hub shaft 144 and this portion of the key member 146 is disposed in a recess 145 formed in the first end 108 of the base 106, and another portion of the key member 146 extends a distance radially outwardly in an opposite direction from the hub shaft 144 and this portion of the key member 146 is disposed in a recess 147 formed in the first end 108 of the hub base 106. The key member 146 thus is secured to the hub shaft 144 by disposing portions of the key member 146 in the recesses 145 and 147 and the key member 146 is secured to the hub shaft 144 by extending a portion of the key member 146 through the opening 143 in the hub shaft 144, the key member 146 cooperating to secure the hub shaft 144 to the base 106 so that rotation of the hub shaft 144 causes the base 106 and the first and the second side plates 108 and 110 connected thereto to rotate.

As generally and partially shown in FIGS. 2, 3, 4 and 5 and as shown more particularly in FIG. 9, the contactor assembly 56 includes a rotatable portion and a non-rotatable portion, as mentioned before. The rotatable portion of the contactor assembly 56 includes a generally circularly shaped insulator plate 150 and a generally circularly shaped contactor plate 152. The insulator plate 150 is constructed of an electrically insulative material, such as a plastic, and the contactor plate 152 is constructed of an electrically conductive material.

As shown in FIG. 8, a portion of the second end 110 of the base 106 extends into and is disposed generally within a portion of the recessed area 140 formed by the second side plate 114. The insulator plate 150 is disposed generally adjacent and connected to the second end 110 of the base 106 and thus the insulator plate 150 is disposed and supported generally within a portion of the recessed area 140 formed by the second side plate 114. The contactor plate 152 is disposed on and connected to the insulator plate 150. The insulator plate 150 thus spaces the contactor plate a distance from the second end 110 of the base 106 and the insulator plate 150 functions to electrically insulate the contactor plate 152 from the base 106 or, on other words, from the hub assembly 52. The contactor plate 152 also is disposed and supported generally within the recessed area 140 formed by the second side plate 114, as shown more clearly in FIG. 8.

As shown in FIG. 9, three circumferentially spaced fasteners 154, 156 and 158 extend through the base 106, and each of the fasteners 154, 156 and 158 extends a distance beyond the second end 110 of the base 106 and into the recessed area 140 formed by the second side plate 114. The insulator plate 150 includes three circumferentially spaced openings 160, 162 and 164, and the openings 160, 162 and 164 are spaced and positioned so that the openings 160, 162 and 164 in the insulator plate 150 are alignable with the portions of the fasteners 154, 156 and 158, respectively, extending into the recessed area 140 formed by the second side plate 114. The contactor plate 152 also includes three openings 166, 168 and 170 and these openings 166, 168 and 170 in the contactor plate 152 are spaced and positioned so that the openings 166, 168 and 170 are alignable with the portions of the fasteners 154, 156 and 158 extending into the recessed area 140 formed by the second side plate 114. The openings 160, 162 and 164 in the insulator plate 150 and the openings 166, 168 and 170 in the contactor plate 152 each have a diameter which is larger than the outside diameter of any of the fasteners 154, 156 and 158. The contactor assembly 56 also includes three plugs 172, 174 and 176 and each of the plugs 172, 174 and 176 is constructed of an insulative material.

In an assembled position of the non-rotatable portion of the contactor assembly 56 as shown in FIG. 8 and as illustrated in FIG. 9, the insulator plate 150 and the contactor plate 152 each are disposed generally near the second end 110 of the base 106 with the insulator plate 150 being interposed generally between the second end 110 of the base 106 and the contactor plate 152. In this position, the insulator plate 150 and the contactor plate 152 each are oriented and moved into a position wherein the fastener 154 extends through the opening 160 in the insulator plate 150 and through the opening 166 in the contactor plate 152, the fastener 156 extends through the opening 162 in the insulator plate 150 and through the opening 168 in the contactor plate 152 and the fastener 158 extends through the opening 164 in the insulator plate 150 and through the opening 170 in the contactor plate 152. The plug 172 is disposed through the opening 166 in the contactor plate 152 and through the opening 160 in the insulator plate 150, the plug 174 is disposed through the opening 168 in the contactor plate 152 and through the opening 162 in the insulator plate 150, and the plug 176 is disposed through the opening 170 in the contactor plate 152 and through the opening 164 in the insulator plate 150. Thus, the fastener 154, more particularly, extends through the opening formed through the plug 172, the fastener 156, more particularly, extends through the opening formed through the plug 174 and the fastener 158, more particularly, extends through the opening formed through the plug 176.

As shown more clearly in FIG. 9, a nut 178 is secured to the portion of the fastener 154 extending beyond the plug 172, a nut 180 is disposed about the portion of the fastener 156 extending beyond the plug 174 and a nut 182 is threadedly disposed about the portion of the fastener 158 extending beyond the plug 176, the nuts 178, 180 and 182 cooperating to threadedly engage the fasteners 154, 156 and 158, respectively, to secure the insulator plate 150 and the contactor plate 152 to the second end 110 of the base 106 with the plugs 172, 174 and 176 cooperating to electrically insulate the contactor plate 152 from the fasteners 154, 156 and 158 and the nuts 178, 180 and 182, thereby cooperating to electrically insulate the contactor plate 152 from the hub assembly 52.

As shown more clearly in FIG. 9, a connector post 184 is secured to the contactor plate 152 and the connector post 184 is adapted so one end of the cable 28 can be removably secured to the connector post 184 for establishing electrical continuity between the cable 28 and the contactor plate 152. The connector post 184, more particularly, includes a screw 186 which is disposed through an opening 188 in the contactor plate 152 and two nuts 190 and 192 are threadedly disposed on the screw 186. The nut 190 is threadedly secured to the screw 186 for securing the screw 186 to the contactor plate 152 and the other nut 192 is threadedly engagable with the nut 186 so one end of the cable 28 can be secured about the screw 186 generally between the two nuts 190 and 192. The head of the screw 186 is disposed within an opening or depression 194 in the insulator plate 150, the opening 194 in the insulator plate 150 being larger than the head of the screw 186 which is disposed therein.

As shown in FIG. 9, an opening 196 extends through the central portion of the insulator plate 150 and an opening 198 is formed through a central portion of the contactor plate 152. The openings 196 and 198 each are larger than the diameter of the hub shaft 144 and the hub shaft 144 extends through the openings 196 and 198 in the insulator plate 150 and the contactor plate 152, respectively.

As shown in FIGS. 8 and 9, one end of the hub shaft 144 extends through an opening formed in a sleeve 200 so that the sleeve 200 is disposed generally about the hub shaft 144 with one end portion of the sleeve 200 being disposed in a recess formed in the second end 110 of the base 106 or, more particularly, in the recess formed in the end of the block 124. A portion of the sleeve 200 extends from the second end 110 of the base 106 and through the openings 196 and 198 formed in the insulator plate 150 and the contactor plate 152.

As shown in FIG. 8, one end of the shaft 144 extends through an opening formed through the first side rail 66 and a bearing 202 is disposed in a counterbore formed in the first frame rail 66 generally concentric with the opening through the first frame rail 66 through which the portion of the hub shaft 44 extends. The hub shaft 144, more particularly, extending through the bearing 202 and the bearing 202 cooperating to journally connect the hub shaft 144 to the first frame rail 66. An end of the hub shaft 144, opposite the end of the hub shaft 144 extending through the first frame rail 66, extends through an opening formed through the second frame rail 72. A bearing 204 is disposed in a counterbore 205 formed in the second frame rail 72 generally concentric with the opening through which the portion of the hub shaft 144 extends. More particularly, the end portion of the hub shaft 144 extends through the bearing 204 and the bearing 204 cooperates to bearingly or journally support the hub shaft 144 on the second frame rail 72. The bearings 202 and 204 thus cooperate to bearingly or journally support the hub shaft 144 in the first and the second frame rails 66 and 72.

As generally shown in FIGS. 2, 4, 5 and 8 and as shown more particularly in FIG. 10, the contactor assembly 56 includes a non-rotatable portion which slidingly contacts the rotatable portion of the contactor assembly 56 to maintain electrical continuity during rotation of the hub assembly 52 and the rotatable portion of the contactor assembly 56, as mentioned before. The non-rotatable portion of the contactor assembly 56, more particularly, includes a contactor 206 (shown in detail in FIG. 10) which is disposed through an opening formed in the second frame rail 72. A portion of the contactor 206 extends from the second frame rail 72 and slidingly engages the contactor plate 152. The end of the contactor 206, opposite the end which slidingly engages the contactor plate 152 is adapted to receive the plug on the end of the cable connector 46 for connecting the contactor 206 to the voltmeter 30.

The contactor 206 includes a contactor base 208 which is constructed of an electrically insulative material, such as a plastic material, for example, having an upper end 210 and a lower end 212. An opening 214 is formed through the upper end 210 of the contactor 206 and the opening 214 extends a distance through the contactor 206 terminating with a surface 216 within the contactor base 208. A bore 218 is formed through the upper end 210 of the base 208 and the bore 218 extends a distance through the contactor base 208. The bore 218 is concentric with and has a diameter larger than the opening 214. An opening 220 is formed through the lower end 212 of the contactor base 208 and the opening 220 intersects the surface 216 formed in the contactor base by the bore 218. The opening 220 has a diameter which is smaller than the diameter of the opening 214.

A plug receiver 222 is threadedly secured in the bore 218 of the contactor base 208. A spring 224 is disposed generally within the opening 214 in the contactor base 208 and a contact pin 226 is disposed through the opening 220 in the contactor base 208. The contact pin 226 has a pin head 230 which engages the surface 216 and limits the movement of the contact pin 226 in the downward direction through the opening 220, the contact pin 226 being moveable in an upward and a downward direction within the opening 220. One end of the spring 224 engages the pin head 230 of the contact pin 226 and the opposite end of the spring 224 engages the end of the plug receiver 222 which is threadedly disposed within the contactor base 208. The spring 224 is sized and adapted to bias the contact pin 226 in the downward direction and a portion of the contact pin 226 extends beyond the lower end 212 of the contactor base 208. The spring 224 and the contact pin 226 each are constructed of an electrically conductive material and thus electrical continuity is established between the contact pin 226 and the spring 224. The opening 228 formed through the plug receiver 222 is adapted to receive a plug on one end of the cable connector 46 for connecting and establishing electrical continuity between the voltmeter 30 and the contactor 206 and, when the plug of the cable connector 46 is disposed within the opening 228 in the plug receiver 222, electrical continuity is established between the contact pin 226 and the cable connector 46 by way of the spring 224 and the plug receiver 222.

A portion of the outer peripheral surface of the contactor base 208, generally near the lower end 212 thereof, is threaded and the contactor base 208 is adapted and sized to be threadedly disposed through an opening formed in the second frame rail 72. The contactor base 208 is positioned in the second frame rail 72 so that the end of the contact pin 226 which extends beyond the lower end 212 of the contactor base 208 slidingly engages the upper surface of the contactor plate 152 to establish electrical continuity between the contactor plate 152 and the contact pin 226, thereby establishing electrical continuity between the contactor plate 152.

As shown in FIG. 9, a notch 231 is formed on one portion of the base 106, a notch 230 is formed in the insulator plate 150 and an opening 232 is formed through a portion of the contactor plate 152. In the assembled position, the notch 231 is aligned with the notch 230 and the opening 232 so that the cable 28 can be extended through the passageway provided by the aligned notches 231 and 230 and the opening 232.

An opening 234 (shown in FIG. 5) is formed through the second side plate 114 and the opening 234 is aligned with the passageway provided by the notches 231 and 230 and the opening 232. One end of the cable 28 then is disposed through the cable receiving opening formed between the first and the second rollers 90 and 96 and this end of the cable 28 then is inserted through the opening 234 in the second side plate 114, this end of the cable 28 further being disposed or inserted through the passageway formed by the notches 231 and 230 and the opening 232 to a position wherein this end of the cable 28 extends a distance above the contactor plate 152. The end of the cable 28 extending above the contactor plate 152 then is electrically connected to the screw 186 and the nut 192 is threadedly moved on the screw 186 to secure this end of the cable 28 on the screw 186 generally between the nuts 190 and 192. The screw 186 is constructed of an electrically conductive material and is connected to the contactor plate 152 so that, when the end of the cable 28 is secured to the screw 186, the cable 28 is in electrical communication with the contactor plate 152 and thus the reference electrode 26 is in electrical communication with the contactor plate 152 by way of the connector post 184 which is connected to the contactor plate 152.

Figure 4:
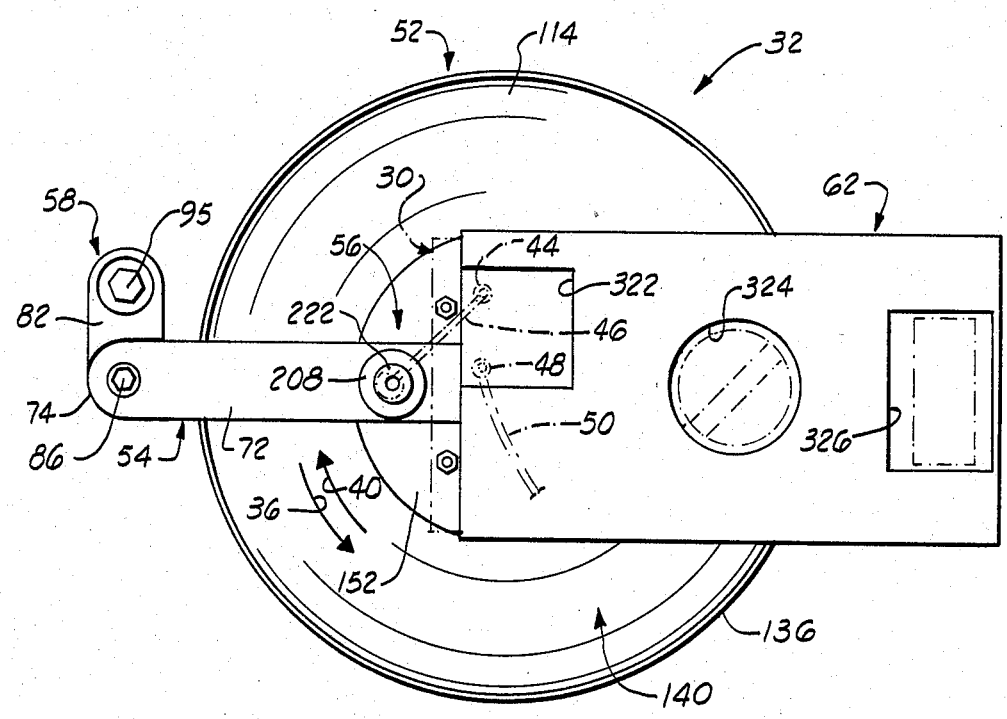
FIG. 4 is an elevational view of one side of the reel shown in FIGS. 2 and 3, opposite the side of the reel shown in FIG. 3.

The handle assembly 34 is generally shown in FIGS. 2, 3 and 4, and the handle assembly 34 more particularly is shown in FIGS. 11-17, inclusive. The handle assembly 34, as shown in FIGS. 11-17, includes a handle 234 having opposite first and second ends 236 and 238, respectively. The first end 236 portion of the handle 234 is adapted to be gripped by an individual for hand operating the handle assembly 34 to rotate the handle assembly 34 in the directions 36 and 40 and for moving the handle assembly 34 to and from the locked and operating positions.

The handle assembly 34 also includes a handle arm 240 having a first end 242 and a second end 244. One end of the hub shaft 144 extends through the second frame rail 72 and through an opening 246 (FIGS. 11 and 16) in the first end 242 portion of the handle arm 240. The hub shaft 144 is secured to the first end 242 portion of the handle arm 240 by a set screw 248 (FIGS. 11 and 16) which extends through a threaded opening 250 (FIGS. 11 and 16) formed in the first end 242 portion of the handle arm 240, the handle arm 240 extending a distance generally radially from the hub shaft 144.

As shown in FIGS. 11, 12 and 16, a slot 252 is formed through the second end 244 of the handle arm 240 and the slot 252 extends a distance through the handle arm 240 terminating with an end surface 254 (designated in FIGS. 12 and 16). A portion of the handle 234, generally near the second end 238 of the handle 234, is disposed within the slot 252 and the handle arm 240, the slot 252 being sized and adapted to receive a portion of the handle 234 generally near the second end 238 of the handle 234. A fastener 256 (FIGS. 11, 12, 16 and 17) extends through the handle arm 240, and the fastener 256 also extends through an opening 257 (FIG. 12) formed through the portion of the handle 234 which is disposed in the slot 252 in the handle arm 240. The fastener 256 pivotally connects the handle 234 to the second end 244 portion of the handle arm 240 so the handle 234 is pivotally movable in a direction 258 (FIGS. 11 and 17) from a locked position to an operating position and in a direction 260 (FIGS. 11 and 17) from an operating position to a locked position. The handle 236 comprises a first segment 264 and a second segment 262. The first segment 264 has a first end and a second end with the first end forming the first end 236 of the handle 234 and the second segment 262 has a first end and a second end with the second end forming the second end 238 of the handle 234. The first end of the first segment 264 is connected to the second end of the second segment 262 and the first segment 264 extends a distance at an angle of ninety degrees from the second segment 262. More particularly, a portion of the first segment 264 extends through the slot 252 and the first segment 264 is pivotally connected to the handle arm 240 by the fastener 256.

An elongated lock slot 266 (FIGS. 11 and 16) is formed through a portion of the second frame rail 72. The lock slot 266 is sized and positioned to receive a portion of the second end 238 portion of the handle 234 or, more particularly, to receive a portion of the first segment 264 in the locked position of the handle assembly 34.

A bore 268 (FIGS. 11, 12, 14 and 16) is formed through the end surface 254 and the handle arm 240 and the bore 268 extend a distance through the handle arm 240 terminating with an end wall 270 (FIGS. 11, 12 and 16). The diameter of the bore 268 is smaller than the diameter of the slot 252.

A generally rectangularly shaped retainer 272 having a first end 274 and a second end 286 is slidingly disposed on the handle arm 240, as shown in FIGS. 11-17. More particularly, an opening 278 is formed through the retainer 272 and the opening 278 (designated in FIGS. 11, 12 and 16) extends through the retainer 272 intersecting the first and the second ends 274 and 276 of the retainer 272. The opening 278 is sized and shaped to slidingly receive the second end 244 portion of the handle arm 240, the second end 244 portion of the handle arm 240 slidingly extending through the opening 278 and the retainer being slidingly supported on the second end 244 portion of the handle arm 240 for movement in a direction 280 and in an opposite direction 282.

A retainer rod 284 (FIGS. 11, 12, 13 and 16) is connected to the retainer 272 about midway between the opposite first and second ends 274 and 276 of the retainer 272. The retainer rod 284 extends generally across the opening 227 formed through the retainer 272. The retainer 272 is oriented on the second end 244 portion of the handle arm 240 so the retainer rod 284 extends through the slot 252 formed through the second end 244 portion of the handle arm 240. One end of a spring 286 (FIGS. 11, 12, 14, 15 and 16) is disposed in the bore 268 of the handle arm 240 with that end of the spring 268 engaging the end wall 270 and the opposite end of the spring 286 engaging the retainer rod 284. The spring 286 biasingly engages the retainer rod 284 and biasingly moves the retainer rod 284 and the retainer 272 connected thereto in the direction 282.

As shown in FIG. 12, a flange 288 is secured to the retainer 272 and the flange 288 extends a distance generally perpendicularly from the retainer 272. The flange 288 provides a surface 290 so an individual manually can engage the surface 290 of the flange 288 and push the retainer 272 in the direction 280.

More particularly, the handle 234 is constructed of an L-shaped member 300 having one end forming the second end 238 of the handle 234 and an opposite end 302 (designated in FIG. 11). The L-shaped member 300 comprises a first member 304 and a second member 306. One end of the first member 304 forms the second end 238 of the handle 234 and the opposite end of the first member 304 is secured to one end of the second member 306, the second member 306 extending a distance generally perpendicularly from the first member 304 and the first member 304 being that portion of the handle 234 which is pivotally connected to the handle arm 240 by the fastener 256. A generally cylindrically shaped handle grip 308 is secured to the end of the second member 306, opposite the end of the second member 306 which is secured to the first member 304, the handle grip 308 being secured to the second member 306 by a fastener 310, the fastener 310 being inserted through an opening 312 formed through the grip 308 and one portion of the fastener 310 threadedly engaging the second member 306.

As shown more clearly in FIGS. 4 and 5, the meter support 62 is generally rectangularly shaped and includes an opening 320 intersecting one end and extending a distance through the meter support 62. A slot 322 is formed in one side of the meter support 62 for providing access to the plug receivers 44 and 48 of the voltmeter 30. An opening 324 is formed in a central portion of one side of the meter support 62 for providing access to the dial on the voltmeter 30. An opening 326 also is formed through this side of the meter support 62 for providing visual access to the meter readout. The meter support 62 is connected to the second frame rail 72 for supporting the voltmeter 30 on the frame assembly 54.

In operation, the contactor base 208 with the plug receiver 222 disposed therein is removed from the second frame rail 72, thereby providing clear access to the opening 320 in the meter support 62. After the contactor base 208 and the plug receiver 222 have been removed from the second frame rail 72, the voltmeter 30 is inserted into the opening 320 and positioned in the opening 320 so that the plug receivers 44 and 48 on the voltmeter 30 are disposed generally within the opening 322, the dial on the voltmeter 30 is disposed generally within the opening 324 and the voltmeter 30 readout is disposed generally within the opening 326. After the voltmeter 30 has been disposed generally within the opening 320 in the meter support 62, the contactor base 208 with the plug receiver 222 connected thereto is threadedly connected to the second frame rail 72 and the contactor base 208 with the plug receiver 222 connected thereto is positioned on the second frame rail 72 so that the contactor base 208 with the plug receiver 222 connected thereto are disposed generally near the opening 320 in the meter support 62 for preventing the voltmeter 30 from sliding out from the opening 320 in the meter support 62 thereby securing the voltmeter 30 in the meter support 62.

As the handle assembly 32 is rotated in the winding and unwinding directions 36 and 40, respectively, to move the reference electrode 26 in the upward and downward directions 38 and 42, respectively, the hub assembly 52 also is rotated in the directions 36 and 40 to wind the cable onto and to unwind the cable from the hub assembly 52, respectively. As the hub assembly 52 is rotated, the insulator plate 150 and the contactor plate 152 are also rotated since these rotatable portions of the contactor assembly 52 are connected to the base 106 of the hub assembly 52. As the contactor plate 152 is rotated, the end of the contact pin 226, opposite the end of the contact pin 226 which is connected to the contactor base 208, slidingly contacts the upper surface of the contactor plate 152 thereby maintaining electrical communication between the contactor plate 152 and the plug receiver 222 by way of the sliding contact between the contact pin 226 and the upper surface of the contactor plate 152. Since the contactor plate 152 is in electrical communication with the cable 28 by way of the connection of the cable 28 to the connector post 184, the cable 28 also is in electrical communication with the plug receiver 222 by way of the sliding contact maintained between the contact pin 226 portion of the contactor 206 and the upper surface of the contactor plate 152 so that electrical communication is established and maintained between the reference electrode 26 and the plug receiver 222 as the hub assembly 54 and the contactor plate 152 are rotated during the operation of the reel 32.

In the locked position of the handle assembly 34, the second end 238 portion of the handle 234 extends beyond the pivotal connection provided by the fastener 256 and into the lock slot 266 formed in the first frame rail 66. In this locked position, the first segment 264 portion of the handle 234 extends generally perpendicular to the handle arm 244 and the second segment 262 portion of the handle 234 extends generally perpendicularly from one end of the first segment 264 portion and generally parallel with the handle arm 240, the second segment 262 portion of the handle 234 being disposed generally adjacent the handle arm 244. Further, in this locked position, the retainer 272 is slidingly biased in the direction 282 by the spring 286 to a position wherein the first end 274 of the retainer 272 engages the first segment 264 portion of the handle 234, the first segment 264 portion of the handle 234 limiting the movement of the retainer 272 in the direction 282.

To move the handle assembly 34 from the locked position to the operating position, the second segment 262 portion of the handle 234 or, more particularly, the grip 308 is grasped by an individual and the handle assembly 34 manually is moved in the direction 258. As the handle assembly 34 is moved in the direction 258, the first segment 264 portion of the handle 234 engages a portion of the first end 274 of the retainer 272 and the first segment 264 portion of the handle 234 forcibly moves the retainer 272 in the direction 280 against the biasing force of the spring 286 as the handle assembly 34 further is moved in the direction 258. The operator continues to move the handle assembly 34 in the direction 258 to a position wherein a portion of the first segment 264 generally near the second end 238 of the handle 234 is disposed within the slot 252 formed in the handle arm 240 and, in this position, the retainer 272 is biasingly moved by the spring 286 in the direction 282 to a position wherein a portion of the retainer 272 generally near the first end 274 thereof is disposed about the slot 252 and the portion of the first segment 264 disposed within the slot 252, the retainer 272 then functioning to secure the handle assembly 34 in the operating position wherein the first segment 264 portion of the handle 234 extends generally parallel with the handle arm 240 with a portion of the first segment 264 portion of the handle 234 being disposed within the slot 252 in the handle arm 240 and the second segment 262 portion of the handle 234 extends in a direction generally perpendicular with the first segment 264 portion of the handle 234 and generally perpendicular with the handle arm 240.

To move the handle assembly 34 from the operating position to the locked position, it first is necessary to free the portion of the first segment 264 portion of the handle 234 which is secured within the slot 252 by the retainer 272. Thus, the operator manually engages the surface 290 of the flange 288 on the retainer 272 and manually pushes the retainer 272 in the direction 280 against the biasing force of the spring 286 to a position wherein the retainer 272 is completely removed from the first segment 264 portion of the handle 234 or, in other words, to a position wherein the first segment 264 portion of the handle 234 is completely removed from the opening 278 in the retainer 272. In this position, the handle 234 is free to be pivoted about the pivotal connection provided by the fastener 256, and the handle 234 and the handle arm 240 then are moved to a position wherein the slot 252 in the handle arm 240 generally is aligned with the lock slot 266 formed in the second frame rail 72. In this aligned position, the handle arm 34 then can be pivoted in the direction 260 for moving the handle assembly 34 to the locked position described before.

With the reel 32 construction, the hub assembly 62 easily can be dismantled and removed from the frame assembly 54 which facilitates the use of hub assemblies 54 with varying base 106 diameters, and the user is not limited to a single base 106 diameter. This feature particularly is useful when using the reel 32 in shallow and deep water applications.

The first and second frame rails 66 and 72 are constructed of aluminum, in one embodiment. Further, the handle arm 240, the retainer 272, the handle 234 except for the grip 308 which is constructed of a plastic material in one embodiment, the bars 80 and 82, the shafts 88 and 94, the base 106, and the side plates 112 and 114 each are constructed of aluminum in one embodiment. The hub shaft 144 and the contactor plate 152 are constructed of a stainless steel in one embodiment. The contactor base 208 and the plus receiver 222 are constructed of a dielectric material (a plastic material) in one embodiment. The contact pin 226 and the spring 224 are constructed of an electrically conductive material.

Changes may be made in the construction and the operation of the various components and assemblies described herein without departing from the spirit and the scope of the invention as defined in the following claims.

What is claimed is:

1. A reel adapted to be operatively connected to one end of a cable for winding portions of the cable onto the reel and for unwinding portions of the cable from the reel, comprising:

a hub assembly operatively connectable to one end portion of the cable and being rotatable in a winding direction for winding portions of the cable onto the hub assembly and being rotatable in an opposite unwinding direction for unwinding portions of the cable from the hub assembly, comprising:

a generally cylindrically shaped base having an outer peripheral surface and being adapted for having portions of the cable wound generally about the base and for having portions of the cable generally unwound from the base, the base having a first and a second end;

a first side plate having an outer peripheral surface and being connected to the first end of the base, the first side plate being generally circularly shaped and extending a distance radially outwardly from the outer peripheral surface of the base;

a second side plate having an outer peripheral surface and being connected to the second end of the base, the second side plate being generally circularly shaped and extending a distance radially outwardly from the outer peripheral surface of the base, the second side plate being spaced a distance from the first side plate by the base and the space between the first and the second side plates cooperating with the outer peripheral surface of the base to form a cable retaining space, the first and the second side plates cooperating with the base to retain portions of the cable wound about the base generally within the cable retaining space; and a frame assembly supporting the hub assembly and the hub assembly being rotatingly connected to the frame assembly for rotation in the winding direction and in the opposite unwinding direction, comprising:
  a first frame rail having a first end and a second end; and
  a second frame rail having a first end and a second end, the second frame rail extending in a plane generally parallel with the first frame rail and being spaced a distance from the first frame rail, the hub assembly being disposed generally between the first frame rail and the second frame rail; and a handle assembly connected to the hub assembly and being adapted for rotating the hub assembly in the winding direction and in the unwinding direction, at least a portion of the handle assembly being movable from an operating position to a locked position and from a locked position to an operating position, a portion of the handle assembly being removably connected to a portion of the frame assembly when the handle assembly is moved to the locked position for locking the handle assembly and the hub assembly connected thereto to the frame assembly for preventing rotation of the hub assembly and the handle assembly connected thereto in the locked position of the handle assembly, the portion of the handle assembly removably connectable to a portion of the frame assembly being removed from connection with the frame assembly when the handle assembly is moved to the operating position of the handle assembly and the handle assembly being movable for rotating the handle assembly and the hub assembly connected thereto in the winding direction and in the unwinding direction in the operating position of the handle assembly;

a hub shaft having opposite ends, the hub shaft extending through the first and the second side plates and through a central portion of the base, one end of the hub shaft extending through the first frame rail and the hub shaft being journally supported in the first frame rail and the opposite end of the hub shaft extending through a portion of the second frame rail and being journally supported within a portion of the second frame rail, the hub shaft being secured to the base so that rotation of the hub shaft causes rotation of the base and the first and the second side plates connected thereto, the handle assembly being connected to the end of the hub shaft extending through the first frame rail;

a cable guide disposed between the first and the second frame rails with one portion of the cable guide being connected to the first frame rail generally near the first end of the first frame rail and another portion of the cable guide being connected to the second frame rail generally near the first end of the second frame rail, the cable guide having a portion adapted to receive a portion of the cable and the cable extending through a portion of the cable guide when the cable is operatively connected to the hub assembly, the cable guide cooperating to guide the cable generally into the cable retaining space and substantially to prevent engagement of the cable with the outer peripheral surfaces of the first and the second side plates during the winding of portions of the cable about the hub assembly and during the unwinding of portions of the cable from the hub assembly; and a contactor assembly having a rotatable portion connected to the end of the hub shaft extending through the second frame rail so the rotatable portion of the contactor assembly rotates with the rotation of the hub assembly and the contactor assembly having a non-rotatable portion connected to the second frame rail and remaining in a stationary position during the rotation of the hub assembly, a portion of the non-rotatable portion of the contactor assembly slidingly contacting a portion of the rotatable portion of the contactor assembly for maintaining electrical continuity between the rotatable portion of the contactor assembly and the non-rotatable portion of the contactor assembly during the rotation of the contactor assembly with the rotation of the hub assembly, one end of the cable being connectable to the rotatable portion of the contactor assembly for establishing electrical continuity between the cable and the contactor assembly and the sliding contact between the non-rotatable portion of the contactor assembly and the rotatable portion of the contactor assembly maintaining electrical continuity between the non-rotatable portion of the contactor assembly and the cable assembly by way of the rotatable portion of the contactor assembly during rotation of the contactor assembly with the rotation of the hub assembly.

2. The rail of claim 1 defined further to include:
a cable guide disposed between the first and the second frame rails with one portion of the cable guide being connected to the first frame rail generally near the first end of the first frame rail and another portion of the cable guide being connected to the second frame rail generally near the first end of the second frame rail, the cable guide having a portion adapted to receive a portion of the cable and the cable being extendable through a portion of the cable guide when the cable is operatively connected to the hub assembly, the cable guide cooperating to guide the cable during the winding of portions of the cable about the hub assembly and during the unwinding of portions of the cable from the hub assembly.

3. The reel of claim 2 wherein the cable guide is defined further to include:
a first shaft having opposite ends with one end of the first shaft being connected to the first frame rail generally near the first end of the first frame rail and the opposite end of the first shaft being connected to the second frame rail generally near the second end of the second frame rail;
a first roller rotatingly disposed on and supported on the first shaft, the first roller having an outer peripheral surface;
a second shaft having opposite ends with one end of the second shaft being connected to the first frame rail generally near the first end of the first frame rail and the opposite end of the second shaft being connected to the second frame rail generally near the first end of the second frame rail; and a second roller disposed on and rotatingly supported on the second shaft, the first and the second shafts and the first and the second rollers supported on the first and the second shafts being positioned so that the outer peripheral surface of the first roller is spaced a distance from the outer peripheral surface of the second roller and the space between the outer peripheral surfaces of the first and the second rollers being sized and adapted for receiving portions of the cable when the cable is operatively connected to the hub assembly.

4. The reel of claim 3 wherein the cable guide is defined further to include:

a first bar connected to the first frame rail generally near the first end of the first frame rail and extending a distance generally perpendicularly from the first frame rail; and a second bar connected to the second frame rail generally near the first end of the second frame rail and extending a distance from the second frame rail; and wherein the second shaft is defined further as having one end connected to the first bar and the opposite end connected to the second bar, the second shaft being connected to the second frame rail by way of the first and the second bars.

5. The reel of claim 2 defined further to include:

a reel grip having opposite ends, with one end of the reel grip being rotatingly connected to the first frame rail generally near the second end of the first frame rail with the opposite end of the reel grip being rotatingly connected to the second frame rail generally near the second end of the second frame rail, the reel grip being grippingly engageable by an individual for assisting the individual in supporting the reel, the reel grip being spaced a distance from the cable guide and the hub assembly being disposed generally between the first and the second frame rails and generally between the cable guide and the reel grip, the reel grip being spaced a distance from the hub assembly and the cable guide being spaced a distance from the hub assembly.

6. The reel of claim 1 wherein the rotatable portion of the contactor assembly is defined further as being interposed generally between the second end of the base of the hub assembly and the second frame rail and wherein the rotatable portion of the contactor assembly is defined further to include:

a generally circularly shaped contactor plate connected to the second end of the base of the hub assembly and being interposed generally between the second end of the base of the hub assembly and the second frame rail, the contactor plate being spaced from the second frame rail and the second end of the base of the hub assembly, the contactor plate being constructed of an electrically conductive material; and wherein the non-rotatable portion of the contactor assembly is defined further to include:

a contactor connected to the second frame rail, one end of the contactor being adapted to receive a plug on one end of a cable connector for connecting the contactor to a voltmeter and the contactor including a portion slidingly contacting the contactor plate to maintain electrical continuity between the contactor plate and the contactor during the rotation of the contactor plate and the hub assembly connected thereto.

7. The reel of claim 6 wherein the contactor assembly is defined further to include:

an insulator plate connected to the second end of the base of the hub assembly, the insulator plate being interposed between the contactor plate and the second end of the base of the hub assembly for electrically insulating the contactor plate from the hub assembly; and means for connecting the contactor plate and the insulator plate to the second end of the base of the hub assembly, said means being adapted to electrically insulate the contactor plate from the hub assembly.

8. The reel of claim 6 wherein the contactor assembly is defined further to include:

a connector post having one portion connected to the contactor plate and another portion adapted for removably connecting one end of the cable to the connector post, the connector post being adapted to establish electrical continuity between the cable connected to the connector post and the contactor plate.

9. The reel of claim 8 wherein the second side plate is further defined to include an opening for receiving and passing through a portion of the cable, and wherein the contactor plate includes an opening for receiving and passing through a portion of the cable and wherein the insulator plate includes a notch for passing through a portion of the cable, one end of the cable being passable through the opening in the second side plate and through the passageway provided by the notch in the insulator plate and the opening in the contactor plate for connecting the end of the cable to the connector post supported on the contactor plate in a connected position of the cable to the contactor plate, the opening in the second side plate being disposed generally near the outer peripheral surface of the base of the hub assembly for operatively connecting one end portion of the cable to the hub assembly.

10. The reel of claim 6 wherein the contactor is defined further to include:

a contactor base connected to the second frame rail and having an upper and a lower end;

a contact pin having one portion connected to the contactor base generally near the lower end of the contactor base and another portion extending a distance from the lower end of the contactor base, the contact pin being movably supported in the contactor base for movement generally between the upper and the lower ends and the contact pin being constructed of an electrically conductive material, the end portion of the contact pin extending beyond the lower end of the contactor base slidingly contacting the contactor plate for establishing electrical continuity between the contact pin and the contactor plate during the rotation of the contactor plate;

a spring supported within a portion of the contactor base having one end engaging a portion of the contact pin supported within the contactor base; and a plug receiver connected to the upper end of the contactor base, the plug receiver being adapted to receive a plug of a cable connector for cooperating in connecting the contactor to a voltmeter and the plug receiver engaging the end of the spring, opposite the end of the spring in engagement with the contact pin, the spring biasing the contact pin in a direction generally from the upper toward the lower end of the contactor base and biasing the contact pin into sliding engagement with the contactor plate and the plug receiver being adapted for receiving a plug on one end of a cable connector so that the received plug is in electrical communication with the spring for connecting the contactor with a voltmeter by way of the cable connector, electrical continuity being established between the plug disposed within the plug receiver and the contactor plate by way of the contact pin and the spring supported in the contactor base.

11. The reel of claim 10 defined further to include:
a meter support connected to the second frame rail having an opening extending through one end thereof and extending a distance therethrough, the opening in the meter support being adapted for receiving a voltmeter so the voltmeter is supportable on the frame assembly, the voltmeter being connected to the plug receiver by way of the cable connector.

12. The reel of claim 1 further defined as being adapted for use in monitoring cathodic protection systems wherein a reference electrode is connected to the end of the cable opposite the end of the cable which is operatively connected to the hub assembly.

13. A reel adapted to be operatively connected to one end of a cable for winding portions of the cable onto the reel and for unwinding portions of the cable from the reel, comprising:
a hub assembly operatively connectable to one end portion of the cable and being rotatable in a winding direction for winding portions of the cable onto the hub assembly and being rotatable in an opposite unwinding direction for unwinding portions of the cable from the hub assembly;
a frame assembly supporting the hub assembly and the hub assembly being rotatingly connected to the frame assembly for rotation in the winding direction and in the opposite unwinding direction; and
a handle assembly connected to the hub assembly and being adapted for rotating the hub assembly in the winding direction and in the unwinding direction, at least a portion of the handle assembly being movable from an operating position to a locked position and from a locked position to an operating position, a portion of the handle assembly being removably connected to a portion of the frame assembly when the handle assembly is moved to the locked position for locking the handle assembly and the hub assembly connected thereto to the frame assembly for preventing rotation of the hub assembly and the handle assembly connected thereto in the locked position of the handle assembly, the portion of the handle assembly removably connectable to a portion of the frame assembly being removed from connection with the frame assembly when the handle assembly is moved to the operating position of the handle assembly and the handle assembly being movable for rotating the handle assembly and the hub assembly connected thereto in the winding direction and in the unwinding direction in the operating position of the handle assembly, comprising:
a handle having a first end and a second end; and
a handle arm having a first end and a second end, a portion of the handle arm generally near the first end of the handle arm being connected to the hub assembly, a portion of the handle generally near the second end of the handle being movably connectable to the handle arm generally near the second end of the handle arm for pivotally moving the handle in one direction from the locked position to the operating position and for pivotally moving the handle in an opposite direction from the operating position to the locked position.

14. The reel of claim 13 wherein the handle arm is defined further as having a slot formed through the second end and extending a distance through the handle arm generally from the second end toward the first end, the slot being sized to receive a portion of the handle generally near the second end of the handle in the operating position of the handle and wherein the handle arm is defined further to include:
a retainer having an opening extending therethrough, the retainer being disposed on and supported on the handle arm so that a portion of the handle arm generally near the second end of the handle arm extends through the opening in the retainer, the retainer being slidingly supported on the handle arm for sliding movement in one direction from the first end toward the second end and in an opposite direction generally from the second end toward the first end of the handle arm, the retainer being slidingly moved to a position on the handle arm wherein the retainer encompasses a portion of the handle arm generally near the second end of the handle arm and a portion of the handle generally near the second end of the handle with such portion of the handle being disposed in the slot in the handle arm so that the retainer retainingly encompasses a portion of the second end portion of the handle disposed within the slot in the handle arm and a portion of the handle thereby locking the second end portion of the handle to the handle arm for locking the handle arm and the handle in the operating position, the retainer being slidingly movable in a direction generally from the second end toward the first end to a position wherein the retainer is removed from a substantial portion of the slot in the handle arm so that the second end portion of the handle can be removed from the slot, the handle being movable from the operating position to the storage position and out of the slot in the handle arm when the retainer has been removed from the portion of the slot in the handle arm encompassing the second end portion of the handle.

15. The reel of claim 14 wherein the handle arm is defined further to include:
a spring disposed generally in the slot in the handle arm and having one end biasingly engaging the retainer for moving the retainer in a direction generally from the first end toward the second end of the handle arm and thereby moving the retainer to a position for encompassing the slot in the handle arm and the second end portion of the handle disposed in the slot thereby biasing the retainer to a position for securing the handle and the handle arm in the operating position.

16. The reel of claim 15 wherein the handle is defined further to include:

a first segment having a first end and a second end, the second end of the first segment forming the second end of the handle and a portion of the first segment being movably connected to the handle arm generally near the second end of the handle arm; and a second segment having a first end and a second end, the first end of the second segment forming the first end of the handle and the second end of the second segment being connected to the first end of the first segment with the first segment extending a distance at an angle from the second segment.

17. The reel of claim 16 wherein the handle arm extends a distance generally radially from the hub assembly, and wherein the first segment extends generally perpendicular to the handle arm and the second segment extends generally parallel with the handle arm in the locked position of the handle assembly, and wherein the first segment extends generally parallel with the handle arm and the second segment extends generally perpendicular to the handle arm in the operating position of the handle assembly.

18. The reel of claim 16 wherein the frame assembly is defined further to include a lock slot formed in a portion thereof, and wherein a portion of the first segment generally near the second end of the first segment is removably disposed in a portion of the lock slot in the locked position of the handle assembly and wherein the second end portion of the first segment is removed from the lock slot in the operating position of the handle assembly.

19. The reel of claim 16 wherein the retainer is biased by the spring into engagement with a portion of the first segment in the locked position of the handle assembly, the retainer cooperating to secure the handle assembly in the locked position, and wherein a portion of the first segment in engagement with a portion of the retainer engages the retainer and moves the retainer against the biasing force of the spring as the handle assembly is moved from the locked position to the operating position.

20. A reel adapted to be operatively connected to one end of a cable for winding portions of the cable onto the reel and for unwinding portions of the cable from the reel, comprising:

a hub assembly operatively connectable to one end portion of the cable and being rotatable in a winding direction for winding portions of the cable onto the hub assembly and being rotatable in an opposite unwinding direction for unwinding portions of the cable from the hub assembly;

a frame assembly supporting the hub assembly and the hub assembly being rotatingly connected to the frame assembly for rotation in the winding direction and in the opposite unwinding direction;

a handle assembly connected to the hub assembly and being adapted for rotating the hub assembly in the winding direction and in the unwinding direction; and a contactor assembly having a rotatable portion connected to the hub assembly so the rotatable portion of the contactor assembly rotates with the rotation of the hub assembly and the contactor assembly having a non-rotatable portion connected to the frame assembly and remaining in a stationary position during the rotation of the hub assembly, a portion of the non-rotatable portion of the contactor assembly slidingly contacting a portion of the rotatable portion of the contactor assembly for maintaining electrical continuity between the rotatable portion of the contactor assembly and the non-rotatable portion of the contactor assembly during the rotation of the contactor assembly with the rotation of the hub assembly, one end of the cable being connectable to the rotatable portion of the contactor assembly for establishing electrical continuity between the cable and the contactor assembly and the sliding contact between the non-rotatable portion of the contactor assembly and the rotatable portion of the contactor assembly maintaining electrical continuity between the non-rotatable portion of the contactor assembly and the cable assembly by way of the rotatable portion of the contactor assembly during rotation of the contactor assembly with the rotation of the hub assembly.

21. The reel of claim 20 wherein the frame assembly is defined further to include:

a first frame rail, the first frame rail having a first end and a second end; and a second frame rail, the second frame rail having a first end and a second end, the second frame rail extending in a plane generally parallel with the first frame rail and being spaced a distance from the first frame rail, the hub assembly being disposed generally between the first frame rail and the second frame rail.

22. The rail of claim 21 defined further to include:

a cable guide disposed between the first and the second frame rails with one portion of the cable guide being connected to the first frame rail generally near the first end of the first frame rail and another portion of the cable guide being connected to the second frame rail generally near the first end of the second frame rail, the cable guide having a portion adapted to receive a portion of the cable and the cable being extendable through a portion of the cable guide when the cable is operatively connected to the hub assembly, the cable guide cooperating to guide the cable during the winding of portions of the cable about the hub assembly and during the unwinding of portions of the cable from the hub assembly.

23. The reel of claim 22 wherein the cable guide is defined further to include:

a first shaft having opposite ends with one end of the first shaft being connected to the first frame rail generally near the first end of the first frame rail and the opposite end of the first shaft being connected to the second frame rail generally near the second end of the second frame rail;

a first roller rotatingly disposed on and supported on the first shaft, the first roller having an outer peripheral surface;

a second shaft having opposite ends with one end of the second shaft being connected to the first frame rail generally near the first end of the first frame rail and the opposite end of the second shaft being connected to the second frame rail generally near the first end of the second frame rail; and a second roller disposed on and rotatingly supported on the second shaft, the first and the second shafts and the first and the second rollers supported on the first and the second shafts being positioned so that the outer peripheral surface of the first roller is spaced a distance from the outer peripheral surface of the second roller and the space between the outer peripheral surfaces of the first and the second rollers being sized and adapted for receiving portions of the cable when the cable is operatively connected to the hub assembly.

24. The reel of claim 23 wherein the cable guide is defined further to include:
a first bar connected to the first frame rail generally near the first end of the first frame rail and extending a distance generally perpendicularly from the first frame rail; and
a second bar connected to the second frame rail generally near the first end of the second frame rail and extending a distance from the second frame rail; and
wherein the second shaft is defined further as having one end connected to the first bar and the opposite end connected to the second bar, the second shaft being connected to the second frame rail by way of the first and the second bars.

25. The reel of claim 22 defined further to include:
a reel grip having opposite ends, with one end of the reel grip being rotatingly connected to the first frame rail generally near the second end of the first frame rail with the opposite end of the reel grip being rotatingly connected to the second frame rail generally near the second end of the second frame rail, the reel grip being grippingly engagable by an individual for assisting the individual in supporting the reel, the reel grip being spaced a distance from the cable guide and the hub assembly being disposed generally between the first and the second frame rails and generally between the cable guide and the reel grip, the reel grip being spaced a distance from the hub assembly and the cable guide being spaced a distance from the hub assembly.

26. The reel of claim 21 wherein the hub assembly is defined further to include:
a generally cylindrically shaped base having an outer peripheral surface and being adapted for having portions of the cable wound generally about the base and for having portions of the cable generally unwound from the base, the base having a first and a second end;
a first side plate having an outer peripheral surface and being connected to the first end of the base, the first side plate being generally circularly shaped and extending a distance radially outwardly from the outer peripheral surface of the base;
a second side plate having an outer peripheral surface and being connected to the second end of the base, the second side plate being generally circularly shaped and extending a distance radially outwardly from the outer peripheral surface of the base, the second side plate being spaced a distance from the first side plate by the base and the space between the first and the second side plates cooperating with the outer peripheral surface of the base to form a cable retaining space, the first and the second side plates cooperating with the base to retain portions of the cable wound about the base generally within the cable retaining space.

27. The reel of claim 26 defined further to include:
a cable guide disposed between the first and the second frame rails with one portion of the cable guide being connected to the first frame rail generally near the first end of the first frame rail and another portion of the cable guide being connected to the second frame rail generally near the first end of the second frame rail, the cable guide having a portion adapted to receive a portion of the cable and the cable extending through a portion of the cable guide when the cable is operatively connected to the hub assembly, the cable guide cooperating to guide the cable generally into the cable retaining space and substantially to prevent engagement of the cable with the outer peripheral surfaces of the first and the second side plates during the winding of portions of the cable about the hub assembly and during the unwinding of portions of the cable from the hub assembly.

28. The reel of claim 26 wherein the hub assembly is defined further to include:
a hub shaft having opposite ends, the hub shaft extending through the first and the second side plates and through a central portion of the base, one end of the hub shaft extending through the first frame rail and the hub shaft being journally supported in the first frame rail and the opposite end of the hub shaft extending through a portion of the second frame rail and being journally supported within a portion of the second frame rail, the hub shaft being secured to the base so that rotation of the hub shaft causes rotation of the base and the first and the second side plates connected thereto, the handle assembly being connected to the end of the hub shaft extending through the first frame rail.

29. The reel of claim 28 wherein the contactor assembly is defined further as having the rotatable portion connected to the end of the hub shaft extending through the second frame rail so the rotatable portion of the contactor assembly rotates with the rotation of the hub assembly and the non-rotatable portion of the contactor assembly being connected to the second frame rail and remaining in a stationary position during the rotation of the hub assembly.

30. The reel of claim 29 wherein the rotatable portion of the contactor assembly is defined further as being interposed generally between the second end of the base of the hub assembly and the second frame rail and wherein the rotatable portion of the contactor assembly is defined further to include:
a generally circularly shaped contactor plate connected to the second end of the base of the hub assembly and being interposed generally between the second end of the base of the hub assembly and the second frame rail, the contactor plate being spaced from the second frame rail and the second end of the base of the hub assembly, the contactor plate being constructed of an electrically conductive material; and
wherein the non-rotatable portion of the contactor assembly is defined further to include:
a contactor connected to the second frame rail, one end of the contactor being adapted to receive a plug on one end of a cable connector for connecting the contactor to a voltmeter and the contactor including a portion slidingly contacting the contactor plate to maintain electrical continuity between the contactor plate and the contactor during the rotation of the contactor plate and the hub assembly connected thereto.

31. The reel of claim 30 wherein the contactor assembly is defined further to include:
an insulator plate connected to the second end of the base of the hub assembly, the insulator plate being interposed between the contactor plate and the second end of the base of the hub assembly for electrically insulating the contactor plate from the hub assembly; and means for connecting the contactor plate and the insulator plate to the second end of the base of the hub assembly, said means being adapted to electrically insulate the contactor plate from the hub assembly.

32. The reel of claim 30 wherein the contactor assembly is defined further to include:

a connector post having one portion connected to the contactor plate and another portion adapted for removably connecting one end of the cable to the connector post, the connector post being adapted to establish electrical continuity between the cable connected to the connector post and the contactor plate.

33. The reel of claim 32 wherein the second side plate is further defined to include an opening for receiving and passing through a portion of the cable, and wherein the contactor plate includes an opening for receiving and passing through a portion of the cable and wherein the insulator plate includes a notch for passing through a portion of the cable, one end of the cable being passable through the opening in the second side plate and through the passageway provided by the notch in the insulator plate and the opening in the contactor plate for connecting the end of the cable to the connector post supported on the contactor plate in a connected position of the cable to the contactor plate, the opening in the second side plate being disposed generally near the outer peripheral surface of the base of the hub assembly for operatively connecting one end portion of the cable to the hub assembly.

34. The reel of claim 30 wherein the contactor is defined further to include:

a contactor base connected to the second frame rail and having an upper and a lower end;

a contact pin having one portion connected to the contactor base generally near the lower end of the contactor base and another portion extending a distance from the lower end of the contactor base, the contact pin being movably supported in the contactor base for movement generally between the upper and the lower ends and the contact pin being constructed of an electrically conductive material, the end portion of the contact pin extending beyond the lower end of the contactor base slidingly contacting the contactor plate for establishing electrical continuity between the contact pin and the contactor plate during the rotation of the contactor plate;

a spring supported within a portion of the contactor base having one end engaging a portion of the contact pin supported within the contactor base; and a plug receiver connected to the upper end of the contactor base, the plug receiver being adapted to receive a plug of a cable connector for cooperating in connecting the contactor to a voltmeter and the plug receiver engaging the end of the spring, opposite the end of the spring in engagement with the contact pin, the spring biasing the contact pin in a direction generally from the upper toward the lower end of the contactor base and biasing the contact pin into sliding engagement with the contactor plate and the plug receiver being adapted for receiving a plug on one end of a cable connector so that the received plug is in electrical communication with the spring for connecting the contactor with a voltmeter by way of the cable connector, electrical continuity being established between the plug disposed within the plug receiver and the contactor plate by way of the contact pin and the spring supported in the contactor base.

35. The reel of claim 34 defined further to include:

a meter support connected to the second frame rail having an opening extending through one end thereof and extending a distance therethrough, the opening in the meters support being adapted for receiving a voltmeter so the voltmeter is supportable on the frame assembly, the voltmeter being connected to the plug receiver by way of the cable connector.

36. The reel of claim 20 further defined as being adapted for use in monitoring cathodic protection systems wherein a reference electrode is connected to the end of the cable opposite the end of the cable which is operatively connected to the hub assembly.

* * * * *